(12) United States Patent
Yoo et al.

(10) Patent No.: US 11,631,743 B2
(45) Date of Patent: Apr. 18, 2023

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Abraham Yoo, Shanghai (CN); Jisong Jin, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 108 days.

(21) Appl. No.: 17/223,238

(22) Filed: Apr. 6, 2021

(65) Prior Publication Data
US 2021/0391432 A1 Dec. 16, 2021

(30) Foreign Application Priority Data
Jun. 11, 2020 (CN) .......................... 202010531867.5

(51) Int. Cl.
*H01L 29/417* (2006.01)
*H01L 23/535* (2006.01)
(Continued)

(52) U.S. Cl.
CPC .. *H01L 29/41791* (2013.01); *H01L 21/76805* (2013.01); *H01L 21/76843* (2013.01);
(Continued)

(58) Field of Classification Search
CPC ...................... H01L 21/76895; H01L 23/5226
See application file for complete search history.

(56) References Cited

U.S. PATENT DOCUMENTS

2018/0138176 A1* 5/2018 Shen ................. H01L 21/76831

\* cited by examiner

*Primary Examiner* — Farun Lu
(74) *Attorney, Agent, or Firm* — Crowell & Moring, L.L.P.

(57) ABSTRACT

A semiconductor structure and a forming method of a semiconductor structure are provided. One form of the forming method includes: providing a base, where a discrete gate structure is formed on the base, a spacer is formed on a side wall of the gate structure, and a source/drain doped layer is formed in the base on two sides of the gate structure, and a bottom dielectric layer covering the source/drain doped layer is formed on the two sides of the gate structure; forming a bottom source/drain plug running through the bottom dielectric layer above the source/drain doped layer, a source/drain cap layer located on a top surface of the bottom source/drain plug, a gate cap layer located on a top surface of the gate structure, and an etching barrier layer located between the gate cap layer and the source/drain cap layer and covering a top surface of the spacer; forming a top dielectric layer covering the gate cap layer, the source/drain cap layer, and the etching barrier layer on the bottom dielectric layer; forming a top source/drain plug that runs through the source/drain cap layer and the top dielectric layer and that is in contact with the bottom source/drain plug; and forming a gate plug that runs through the gate cap layer and the top dielectric layer and that is in contact with the gate structure. Embodiments of the present disclosure help improve the performance of the semiconductor structure.

16 Claims, 12 Drawing Sheets

(51) Int. Cl.
*H01L 29/78* (2006.01)
*H01L 21/768* (2006.01)
*H01L 29/66* (2006.01)
*H01L 29/40* (2006.01)
*H01L 23/522* (2006.01)

(52) U.S. Cl.
CPC .... *H01L 21/76895* (2013.01); *H01L 23/5226* (2013.01); *H01L 23/535* (2013.01); *H01L 29/401* (2013.01); *H01L 29/66795* (2013.01); *H01L 29/7851* (2013.01)

SEMICONDUCTOR STRUCTURE AND FORMING METHOD THEREOF

RELATED APPLICATIONS

The present application claims priority to Chinese Patent Appln. No. 202010531867.5, filed Jun. 11, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

With the continuous development of integrated circuit manufacturing technologies, people have increasingly high requirements on the integration level and performance of integrated circuits. To improve the integration level and reduce costs, critical dimensions of the components are continuously reduced, and the circuit density inside the integrated circuit is becoming increasingly high. Such a development trend makes the wafer surface unable to provide a sufficient area for fabricating required interconnection lines.

To meet the requirement of the interconnection lines after the critical dimensions are reduced, currently, the connection between different metal layers or between a metal layer and a base is implemented through an interconnection structure. The interconnection structure includes the interconnection lines and contact hole plugs formed inside a contact opening. The contact hole plugs are connected to a semiconductor device, and the interconnection lines implement connection between the contact hole plugs, so as to form a circuit. The contact hole plugs inside a transistor structure include a gate contact hole plug, which is located on a surface of a gate structure and configured to implement connection between the gate structure and an external circuit; and further include a source/drain contact hole plug, which is located on a surface of a source/drain doped layer and configured to implement connection between the source/drain doped layer and an external circuit.

Currently, to further reduce the transistor area, a contact over active gate (COAG) process is introduced. Compared with the conventional gate contact hole plug located above a gate structure of an isolation area, the gate contact hole plug can be fabricated above a gate structure of an active area (AA) by using the COAG process, so as to further save the area of chip.

SUMMARY

A problem addressed by embodiments and implementations of the present disclosure is to provide a semiconductor structure and a forming method thereof, so as to help improve the performance and production manufacturing yield of the semiconductor structure.

To address the problem, one form of the present disclosure provides a forming method of a semiconductor structure, including: providing a base, where a discrete gate structure is formed on the base, a spacer is formed on a side wall of the gate structure, and a source/drain doped layer is formed in the base on two sides of the gate structure, and a bottom dielectric layer covering the source/drain doped layer is formed on the two sides of the gate structure; forming a bottom source/drain plug that runs through the bottom dielectric layer above the source/drain doped layer and that is in contact with the source/drain doped layer, a source/drain cap layer located on a top surface of the bottom source/drain plug, a gate cap layer located on a top surface of the gate structure, and an etching barrier layer located between the gate cap layer and the source/drain cap layer and covering a top surface of the spacer; forming a top dielectric layer covering the gate cap layer, the source/drain cap layer, and the etching barrier layer on the bottom dielectric layer; forming a top source/drain plug that runs through the source/drain cap layer and the top dielectric layer and that is in contact with the bottom source/drain plug; and forming a gate plug that runs through the gate cap layer and the top dielectric layer and that is in contact with the gate structure.

Another form of the present disclosure provides a semiconductor structure, including: a gate structure, discretely disposed on the base; a spacer, located on a side wall of the gate structure; a source/drain doped layer, located in the base on two sides of the gate structure; a bottom dielectric layer, located on the two sides of the gate structure and covering the source/drain doped layer; a bottom source/drain plug, running through the bottom dielectric layer above the source/drain doped layer, where a bottom of the bottom source/drain plug is in contact with the source/drain doped layer; a gate cap layer, located on a top surface of the gate structure; a source/drain cap layer, located on a top surface of the bottom source/drain plug; and an etching barrier layer, located between the gate cap layer and the source/drain cap layer and covering a top surface of the spacer.

Compared with the prior art, technical solutions of embodiments and implementations of the present disclosure have the following advantages.

In implementations of a forming method of a semiconductor structure provided in the present disclosure, an etching barrier layer that is located between the gate cap layer and the source/drain cap layer and that covers the top surface of the spacer is further formed. A direction parallel to the base and perpendicular to an extension direction of the gate structure is a lateral direction, and the process of forming the top source/drain plug includes the step of etching the top dielectric layer and the source/drain cap layer to form a top source/drain contact hole exposing the bottom source/drain plug. By forming the etching barrier layer, in the process of forming the top source/drain contact hole, the etching barrier layer can define a lateral etching stop position, and the etching barrier layer can protect the spacer, thereby helping reduce a probability that the spacer is mistakenly etched using the etching process of forming the top source/drain contact hole. Moreover, the etching barrier layer can further isolate the top source/drain plug from the gate structure. Both of the two aspects help prevent a problem of bridging or breakdown between the top source/drain plug and the gate structure at a top corner of the spacer. The process of forming the gate plug generally includes the step of etching the top dielectric layer and the gate cap layer to form a gate contact hole exposing the gate structure. By forming the etching barrier layer, in the process of forming the gate contact hole, the etching barrier layer can define a lateral etching stop position, and the etching barrier layer can protect the spacer, thereby helping reduce a probability that the spacer is mistakenly etched using the etching process of forming the gate contact hole, and further prevent a problem of bridging or breakdown between the gate plug and the bottom source/drain plug at the top corner of the spacer. Based on the foregoing, embodiments and implementations of the present disclosure help improve the performance and production manufacturing yield of the semiconductor structure.

DETAILED DESCRIPTION

Figure 1:
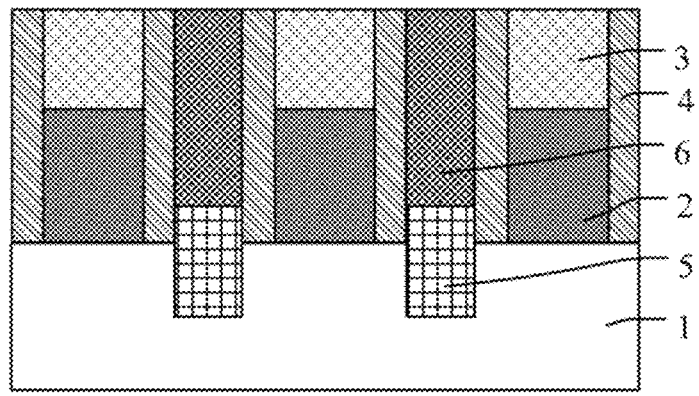
FIG. 1 to FIG. 3 are schematic structural diagrams corresponding to steps in a forming method of a semiconductor structure.
Figure 2:
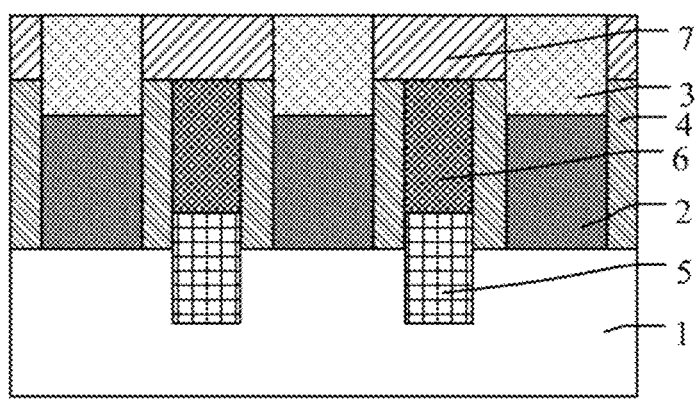
Figure 3:
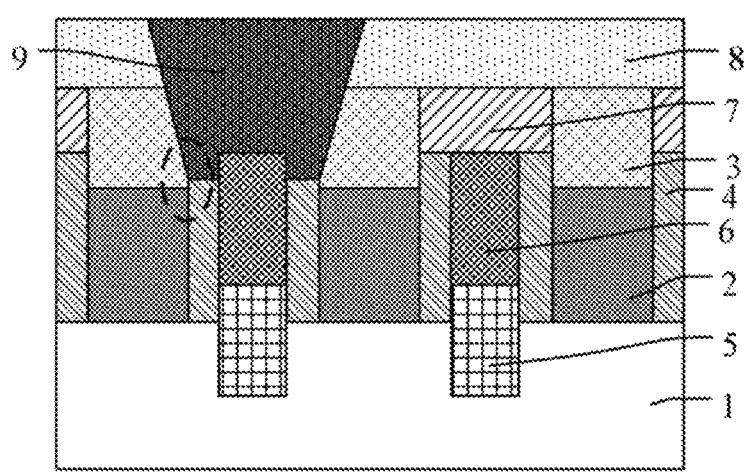

Devices formed at present using a contact over active gate (COAG) process have a problem with poor performance. Reasons for the poor performance of the devices are analyzed now with reference to a forming method of a semiconductor structure. FIG. 1 to FIG. 3 are schematic structural diagrams corresponding to steps in a forming method of a semiconductor structure.

Referring to FIG. 1, a base 1 is provided, a gate structure 2 is formed on the base 1, a first cap layer 3 is formed on a top surface of the gate structure 2, a spacer 4 is formed on the side walls of the gate structure 2 and the first cap layer 3, a source/drain doped layer 5 is formed in the base 1 on two sides of the gate structure 2 and the spacer 4, a bottom dielectric layer (not shown in the figure) covering the source/drain doped layer 5 is formed on the base 1 exposed by the gate structure 2, the bottom dielectric layer exposes a top surface of the first cap layer 3, in an extension direction perpendicular to the gate structures 2, a bottom source/drain plug 6 that is in contact with the source/drain doped layer 5 is formed in the bottom dielectric layer between adjacent gate structures 2, and a side wall of the bottom source/drain plug 6 is in contact with the spacer 4.

Referring to FIG. 2, the bottom source/drain plug 6 and a part of a thickness of the spacer 4 of are removed. A second cap layer 7 is formed on the bottom source/drain plug 6, where a side wall of the second cap layer 7 is in contact with the first cap layer 3, and the second cap layer 7 covers the spacer 4 and the bottom source/drain plug 6.

Referring to FIG. 3, a top dielectric layer 8 covering the bottom dielectric layer 6, the first cap layer 3, and the second cap layer 7 is formed. A top source/drain plug 9 that runs through the second cap layer 7 and the top dielectric layer 8 and that is in contact with the bottom source/drain plug 6 is formed.

In implementations of the forming method, in the process of forming the top source/drain plug 9 in, a source/drain contact hole that runs through the second cap layer 7 and the top dielectric layer 8 and that exposes the bottom source/drain plug 6 needs to be first formed, and the top source/drain plug 9 is then formed in the source/drain contact hole. To ensure that the source/drain contact hole can expose a top surface of the bottom source/drain plug 6, to provide the top source/drain plug 9 and the bottom source/drain plug 6 with a sufficiently large contact area, in the process of forming the source/drain contact hole, generally, over etching is further performed. In the over etching process, the spacer 4 located on a side wall of the bottom source/drain plug 7 is easily mis-etched. Therefore, a weak point (as shown by a dotted line circle in FIG. 3) is easily formed at a bottom corner of the spacer 4, and a problem of bridging or breakdown between the top source/drain plug 10 and the gate structure 2 easily occurs at the weak point, easily reducing the performance and production manufacturing yield of the semiconductor structure.

Figure 4:
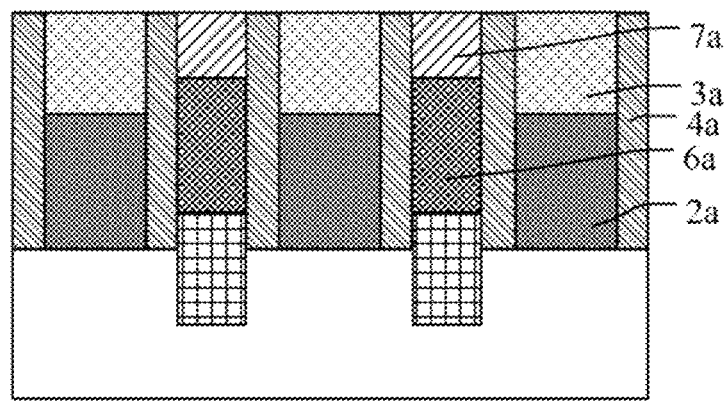
FIG. 4 to FIG. 5 are schematic structural diagrams corresponding steps in another forming method of a semiconductor structure.
Figure 5:
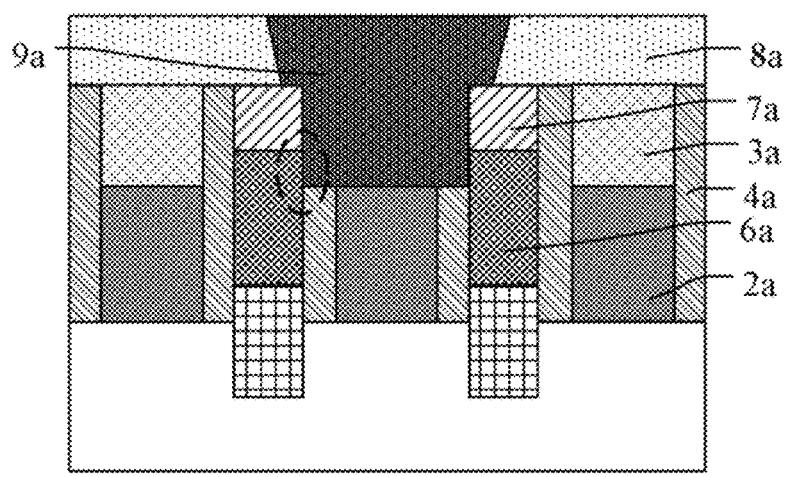

Referring to FIG. 4 and FIG. 5, another forming method of a semiconductor structure is provided. FIG. 4 to FIG. 5 are schematic structural diagrams corresponding to steps in another forming method of a semiconductor structure. Similarities between the forming method of a semiconductor structure of FIGS. 1-3 and the forming method of a semiconductor structure of FIG. 4 and FIG. 5 are not described herein again, with the following discussion focusing on the differences between the methods.

Referring to FIG. 4, a part of a thickness of a bottom source/drain plug 6a is removed. A second cap layer 7a is formed on the bottom source/drain plug 6a, and a side wall of the second cap layer 7a is in contact with a side wall of a spacer 4a.

Referring to FIG. 5, a top dielectric layer 8a covering a bottom dielectric layer (not shown in the figure), a first cap layer 3a, and the second cap layer 7a is formed. A gate plug 9a that runs through the first cap layer 3a and the top dielectric layer 8a and that is in contact with a gate structure 2a is formed.

In implementations of the forming method, the gate plug 9a is formed on an active area (AA), and the gate plug 9a is a contact over active gate (COAG). In the process of removing the part of the thickness of the bottom source/drain plug 6a, only the part of the thickness of the bottom source/drain plug 6a is removed, and the spacer 4a is not etched, so that the side wall of the second cap layer 7a is in contact with the side wall of the spacer 4a. In the process of forming a top source/drain plug (not shown in the figure), the spacer 4a covers a side wall of the bottom source/drain plug 6a, the weak point does not easily exist, and the spacer 4a can isolate the gate structure 2a from the top source/drain plug.

However, in the foregoing method, in the process of forming the gate plug 9a, a gate contact hole (not shown in the figure) that runs through the first cap layer 3a and the top dielectric layer 8a and that exposes the gate structure 2a needs to be first formed, and the gate plug 9a is then formed in the gate contact hole. To ensure that the gate contact hole exposes a top surface of the gate structure 2a and to provide the gate plug 9a and the gate structure with a sufficiently large contact area, in the process of forming the gate contact hole, generally, over etching is further performed. In the over-etching process, mis-etching is also easily caused on the first cap layer 3a and the spacer 4a of the side wall of the gate structure 2a, and further, the problem of bridging or breakdown between the gate plug 9a and the bottom source/ drain plug 6a (as shown at a position of a dotted-line circle in FIG. 5) is easily caused, resulting in poor performance of the semiconductor structure, and low production manufacturing yield.

To address the technical problem, in some implementations of the forming method of a semiconductor structure provided in the present disclosure, by forming the etching barrier layer, in the process of forming the top source/drain contact hole, the etching barrier layer can define a lateral etching stop position, and the etching barrier layer can protect the spacer, thereby helping reduce a probability that the spacer is mistakenly etched by using the etching process of forming the top source/drain contact hole. Moreover, the etching barrier layer can further isolate the top source/drain plug from the gate structure. Both of the two aspects help prevent a problem of bridging or breakdown between the top source/drain plug and the gate structure at a top corner of the spacer. The process of forming the gate plug generally includes the step of etching the top dielectric layer and the gate cap layer to form a gate contact hole exposing the gate structure. By forming the etching barrier layer, in the process of forming the gate contact hole, the etching barrier layer can define a lateral etching stop position, the etching barrier layer can protect the spacer, thereby helping reduce a probability that the spacer is mistakenly etched by using the etching process of forming the gate contact hole, and further prevent a problem of bridging or breakdown between the gate plug and the bottom source/drain plug at the top corner of the spacer. Based on the foregoing, embodiments and implementations of the present disclosure help improve the performance and production manufacturing yield of the semiconductor structure.

To make the foregoing objectives, features, and advantages of embodiments and implementations of the present disclosure more apparent and easier to understand, specific embodiments and implementations of the present disclosure are described in detail below with reference to the drawings.

FIG. 6 to FIG. 21 are structural schematic diagrams corresponding to steps in one form of a forming method of a semiconductor structure according to the present disclosure.

Figure 6:
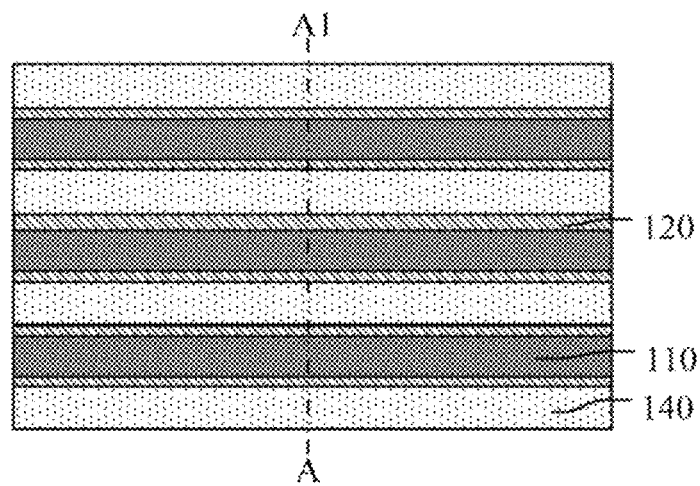
FIG. 6 to FIG. 21 are structural schematic diagrams corresponding to steps in one form of a forming method of a semiconductor structure according to the present disclosure.
Figure 7:
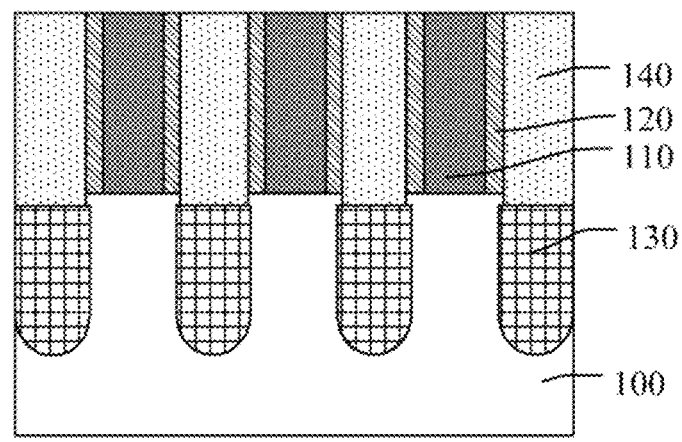

Referring to FIG. 6 and FIG. 7, FIG. 6 is a top view, and FIG. 7 is a cross-sectional view of FIG. 6 at AA1. A base 100 is provided, a discrete gate structure 110 is formed on the base 100, a spacer 120 is formed on a side wall of the gate structure 110, a source/drain doped layer 130 is formed in the base 100 on two sides of the gate structure 110, and a bottom dielectric layer 140 covering the source/drain doped layer 130 is formed on the two sides of the gate structure 110.

The base 100 is configured to provide a process platform for subsequent processes. In some implementations, the base 100 is configured to form a fin field effect transistor (FinFET). The base 100 is a three-dimensional base, and includes a substrate (not shown) and a fin (not shown) protruding from the substrate. In other implementations, when the base is configured to form a planar field effect transistor, the base is correspondingly a planar base.

In some implementations, the substrate is a silicon substrate. In some implementations, the fin has the same material as the substrate. When the device is in operation, the gate structure 110 is configured to control on or off of a conductive channel.

In some implementations, the gate structure 110 is located on the substrate, and spans the fin and covers a part of a top surface and a part of a side wall of the fin.

In some implementations, the gate structure 110 is a metal gate structure. The gate structure 110 includes a high-k gate dielectric layer (not shown) and a gate electrode layer (not shown) located on the high-k gate dielectric layer.

A material of the high-k gate dielectric layer is a high-k dielectric material, and the high-k dielectric material refers to a dielectric material whose relative dielectric constant is greater than a relative dielectric constant of silicon oxide. Specifically, the material of the high-k gate dielectric layer may be selected from $HfO_2$, $ZrO_2$, HfSiO, HfSiON, HfTaO, HfTiO, HfZrO or $Al_2O_3$. A material of the gate electrode layer is Al, Cu, Ag, Au, Pt, Ni, Ti or W.

The spacer 120 is configured to define a forming area of the source/drain doped layer 130, and is further configured to protect the side wall of the gate structure 110. A material of the spacer 120 may be one or more of silicon oxide, silicon nitride, silicon oxynitride, silicon carbide, silicon oxycarbonitride, silicon oxycarbide, boron nitride, and boron carbonitride. The spacer 120 may be a single-layer structure or a laminated structure. In some implementations, the spacer 120 is the laminated structure. Specifically, the spacer 120 is an oxide nitride oxide (ONO) structure.

When the device is in operation, the source/drain doped layer 130 is configured to provide stress for the channel, to improve the carrier mobility. In some implementations, the source/drain doped layer 130 is located in the gate structure 110 and the fin on two sides of the spacer 120.

When an NMOS transistor is formed, the source/drain doped layer 130 includes a stress layer doped with N-type ions, a material of the stress layer is Si or SiC, and the stress layer provides a tensile stress effect for a channel area of the NMOS transistor, thereby helping improve the carrier mobility of the NMOS transistor, where the N-type ions are P ions, As ions or Sb ions. When a PMOS transistor is formed, the source/drain doped layer 130 includes a stress layer doped with P-type ions, a material of the stress layer is Si or SiGe, and the stress layer provides a compressive stress effect for a channel area of the PMOS transistor, thereby helping improve the carrier mobility of the PMOS transistor, where the P-type ions are B ions, Ga ions or In ions.

In some implementations, adjacent gate structures 110 share one source/drain doped layer 130.

The bottom dielectric layer 140 is configured to implement isolation between adjacent devices. Subsequently, a bottom source/drain plug that is in contact with the source/drain doped layer 130 is further formed in the bottom dielectric layer 140 above the source/drain doped layer 130, and the bottom dielectric layer 140 is further configured to implement electrical isolation between the bottom source/drain plugs.

In some implementations, the bottom dielectric layer 140 is an inter layer dielectric (ILD). Based on this, a material of the bottom dielectric layer 140 is a dielectric material, for example, one or more of silicon oxide, silicon nitride, silicon oxynitride, silicon oxycarbide, silicon carbonitride, and silicon oxycarbonitride. In some implementations, the material of the bottom dielectric layer 140 is silicon oxide.

Referring to FIG. 8 to FIG. 14, a bottom source/drain plug 150 that runs through the bottom dielectric layer 140 above the source/drain doped layer 130 and that is in contact with the source/drain doped layer 130, a source/drain cap layer 155 located on a top surface of the bottom source/drain plug 150, a gate cap layer 115 located on a top surface of the gate structure 110, and an etching barrier layer 160 that is located between the gate cap layer 115 and the source/drain cap layer 155 and that covers a top surface of the spacer 120 are formed.

The subsequent steps further include: forming a top dielectric layer covering the gate cap layer 115, the source/drain cap layer 155, and the etching barrier layer 160 on the bottom dielectric layer 140; forming a top source/drain plug that runs through the source/drain cap layer 155 and the top dielectric layer and that is in contact with the bottom source/drain plug 150; and forming a gate plug that runs through the gate cap layer 115 and the top dielectric layer and that is in contact with the gate structure 110.

In some implementations of the present disclosure, an etching barrier layer 160 that is located between the gate cap layer 115 and the source/drain cap layer 155 and that covers the top surface of the spacer 120 is further formed. A direction parallel to the base 100 and perpendicular to an extension direction of the gate structure 110 is a lateral direction, and the process of forming the top source/drain plug includes the step of etching the top dielectric layer and the source/drain cap layer 155, to form a top source/drain contact hole exposing the bottom source/drain plug 150. By forming the etching barrier layer 160, in the process of forming the top source/drain contact hole, the etching barrier layer 160 can define a lateral etching stop position, and the etching barrier layer 160 can protect the spacer 120, thereby helping reduce a probability that the spacer 120 is mistakenly etched using the etching process of forming the top source/drain contact hole. Moreover, the etching barrier layer 160 can further isolate the top source/drain plug from the gate structure 110. Both of the two aspects help prevent a problem of bridging or breakdown between the top source/drain plug and the gate structure 110 at a top corner of the spacer 120.

The process of forming the gate plug includes the step of etching the top dielectric layer and the gate cap layer 115 to form a gate contact hole exposing the gate structure 110. By forming the etching barrier layer 160, in the process of forming the gate contact hole, the etching barrier layer 160 can define a lateral etching stop position, and the etching barrier layer 160 can protect the spacer 120, thereby helping reduce a probability that the spacer 120 is mistakenly etched by the etching process of forming the gate contact hole, and further prevent a problem of bridging or breakdown between the gate plug and the bottom source/drain plug 150 at the top corner of the spacer 120.

Based on the foregoing, embodiments and implementations of the present disclosure help improve the performance and production manufacturing yield of the semiconductor structure.

The bottom source/drain plug 150 is in contact with the source/drain doped layer 130, and is configured to implement an electrical connection between the bottom source/drain plug 150[MI1] and an external circuit or other interconnection structures. In some implementations, a top source/drain plug that is in contact with the bottom source/drain plug 150 is subsequently formed on the bottom source/drain plug 150, and an electrical connection is implemented between the top source/drain plug and the source/drain doped layer 130 by using the bottom source/drain plug 150.

In some implementations, a material of the bottom source/drain plug 150 is copper. The copper has a lower resistivity, thereby being beneficial to alleviate a signal delay of a back-end RC, improve a processing speed of the chip, further reduce resistance of the bottom source/drain plug 150, and correspondingly reduce power consumption. In other implementations, the material of the bottom source/drain plug may alternatively be a conductive material such as tungsten or cobalt.

A gate plug that is in contact with the gate structure 110 is subsequently formed on the base 100 of the AA, and the source/drain cap layer 155 is located on the top surface of the bottom source/drain plug 150, and is configured to protect the bottom source/drain plug 150 in the process of forming the gate plug, thereby helping reduce a probability of damage to the bottom source/drain plug 150 and a short-circuit problem between the gate plug and the bottom source/drain plug 150.

The source/drain cap layer 155 selects a material having etching selectivity with the gate cap layer 115, the spacer 120, the bottom dielectric layer 140, and the subsequently formed top dielectric layer, thereby helping ensure that the source/drain cap layer 155 can protect the bottom source/drain plug 150.

In some implementations, a material of the source/drain cap layer 155 includes one or more of $SiO_2$, SiC, SiCO, $Si_3N_4$, and $SiC_xN_y$. $SiC_xN_y$ refers to nitrogen doped carbide (NDC).

The subsequent steps further include: forming a top source/drain plug that is in contact with the bottom source/drain plug 150 on the bottom source/drain plug 150, where the gate cap layer 115 is located on the top surface of the gate structure 110, and is configured to protect the gate structure 110, thereby helping reduce a probability of damage to the gate structure 110 and a short-circuit problem between the top source/drain plug and the gate structure 110.

The gate cap layer 115 selects a material having etching selectivity with the source/drain cap layer 155, the spacer 120, the bottom dielectric layer 140, and the subsequently formed top dielectric layer, thereby helping ensure that the gate cap layer 115 can protect the gate structure 110. A material of the gate cap layer 115 includes one or more of SiC, SiCO, $Si_3N_4$, $SiC_xN_y$, SiCN—C+ and SiCN—N+.

The etching barrier layer 160 covers the top surface of the spacer 120, and is located between the gate cap layer 115 and the source/drain cap layer 155.

In the subsequent step of forming the top source/drain contact hole, the etching barrier layer 160 can define the lateral etching stop position, and the etching barrier layer 160 can protect the spacer 120, thereby helping reduce a probability that the spacer 120 is mistakenly etched by using the etching process of forming the top source/drain contact hole. Moreover, the etching barrier layer 160 can further isolate the top source/drain plug from the gate structure 110. Both of the two aspects help reduce the probability of the bridging or breakdown problem between the top source/drain plug and the gate structure 110 at the top corner of the spacer 150.

In the subsequent process of forming the gate contact hole, the etching barrier layer 160 can define a lateral etching stop position, and the etching barrier layer 160 can protect the spacer 120, thereby helping reduce the probability that the spacer 120 is mistakenly etched by the etching process of forming the gate contact hole, and further prevent the problem of bridging or breakdown between the gate plug and the bottom source/drain plug 150 at the top corner of the spacer 120.

Based on this, the etching barrier layer 160 selects a material having etching selectivity with the gate cap layer 115, the source/drain cap layer 155, the spacer 120, the bottom dielectric layer 140, and the subsequent top dielectric layer, and the etching process of subsequently forming the source/drain contact hole or the gate contact hole has a low etching rate on the etching barrier layer 160. In some implementations, a material of the etching barrier layer 160 includes one or more of silicon oxycarbide, silicon oxynitride, and silicon nitride.

In an example, the step of forming the bottom source/drain plug 150, the source/drain cap layer 155, the gate cap layer 115, and the etching barrier layer 160 includes: forming the etching barrier layer 160 on the side wall of the gate cap layer 115 after the bottom source/drain plug 150 and the gate cap layer 115 are formed; and forming the source/drain cap layer 155 covering a side wall of the etching barrier layer 160 on the top surface of the bottom source/drain plug 150.

In an example, the forming method of a semiconductor structure further includes: further forming an adhesion layer 165 located on the side wall of the gate cap layer 115 and the top surface of the spacer 120 in the step of forming the etching barrier layer 160. Correspondingly, the etching barrier layer 160 covers the adhesion layer 165 located on the top surface of the spacer 120 and the side wall of the gate cap layer 115.

The adhesion layer 165 has a stress buffering effect between the etching barrier layer 160 and the spacer 120, or between the gate cap layer 115 and the etching barrier layer 160, to improve adhesiveness between the etching barrier layer 160 and the spacer 120, and adhesiveness between the gate cap layer 115 and the etching barrier layer 160, thereby helping prevent the etching barrier layer 160 from being directly in contact with the side wall of the gate cap layer 115 and the top surface of the spacer 120 to generate problems of defects such as a relatively large stress and dislocations, further improve the forming quality of the etching barrier layer 160, and correspondingly ensure the effect that the etching barrier layer 160 is configured to define the lateral etching stop position.

In some implementations, a material of the adhesion layer 165 includes one or more of silicon carbide, silicon oxide, titanium nitride, tantalum, and tantalum nitride. Compared with the thickness of the etching barrier layer 160, the thickness of adhesion layer 165 is thinner, so that the effect that the etching barrier layer 160 is configured to define the lateral etching stop position is ensured while the adhesiveness between the etching barrier layer 160 and the spacer 120, and the adhesiveness between the gate cap layer 115 and the etching barrier layer 160 are improved.

One form of the specific steps of forming the bottom source/drain plug 150, the source/drain cap layer 155, the gate cap layer 115, and the etching barrier layer 160 are described in detail below with reference to the accompanying drawings.

Figure 8:
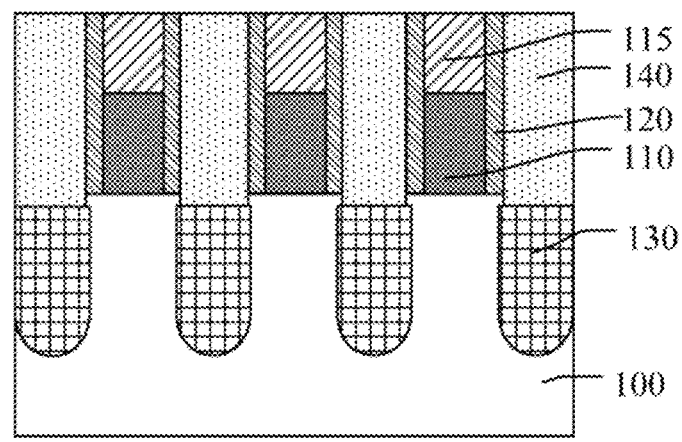

As shown in FIG. 8, a part of a thickness of the gate structure 110 is etched back, and the gate cap layer 115 is formed on the top surface of the gate structure 110. The spacer 120 covers the side walls of the gate structure 110 and the gate cap layer 115. The part of the thickness of the gate structure 110 is etched back, to provide space for forming the gate cap layer 115.

After the part of a thickness of the gate structure 110 is etched back, a top surface of a remaining gate structure 110 and the spacer 120 are encircled to form a groove (not shown in the figure). Correspondingly, the groove provides space for forming the gate cap layer 115.

In some implementations, the part of a thickness of the gate structure 110 is etched back by using a dry etching process. The dry etching process facilitates precise control of the etching thickness of the gate structure 110, and correspondingly, helps make the thickness of the gate cap layer meet design requirements.

In some implementations, the step of forming the gate cap layer 115 includes: filling the gate cap layer 115 in the groove. Specifically, a gate cap material layer is filled in the groove, and further covers a part of a top surface of the bottom dielectric layer 140; and the gate cap material layer above the top surface of the bottom dielectric layer 140 is removed, and the remaining gate cap material layer in the groove is used as the gate cap layer 115.

The gate cap material layer is formed using a deposition process, for example, a chemical vapor deposition (CVD) process.

The gate cap material layer above the top surface of the bottom dielectric layer 140 is removed using a planarization process, for example, a chemical mechanical polishing (CMP) process.

Figure 9:
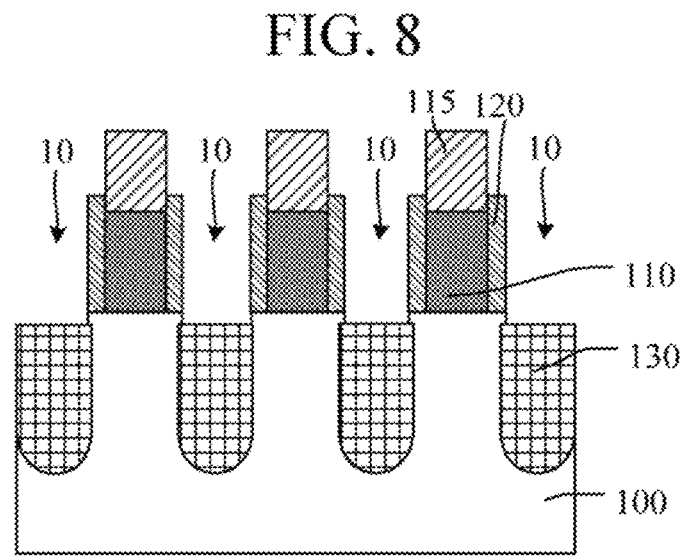
Figure 10:
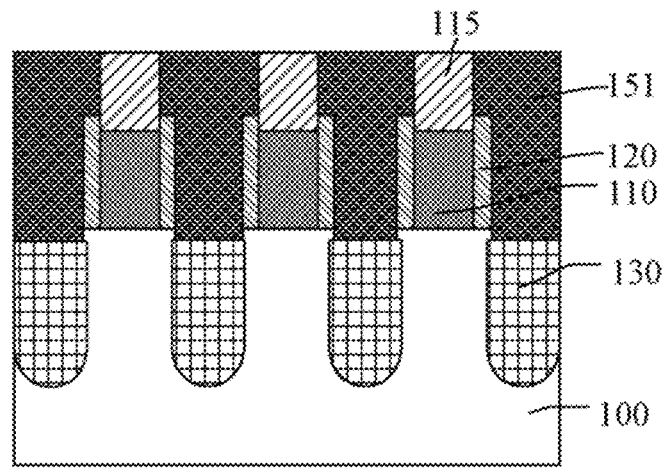
Figure 11:
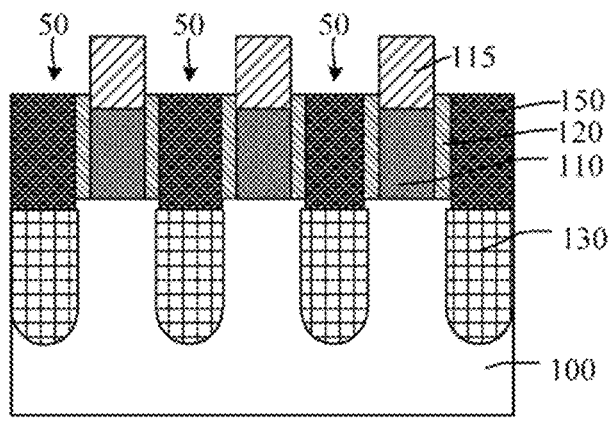

As shown in FIG. 9 to FIG. 11, a bottom source/drain plug 150 that runs through the bottom dielectric layer 140 above the source/drain doped layer 130 is formed, and a top surface of the bottom source/drain plug 150 is lower than the top surface of the gate cap layer 115.

In some implementations, the step of forming the bottom source/drain plug 150 includes: as shown in FIG. 9, etching the bottom dielectric layer 140 above the source/drain doped layer 130, to form a bottom source/drain contact hole 10 exposing the source/drain doped layer 130; as shown in FIG. 10, forming an initial plug 151 in the bottom source/drain contact hole 10, where a top surface of the initial plug 151 is flush with the top surface of the gate cap layer 115; and as shown in FIG. 11, etching back a part of a thickness of the initial plug 151, to form the bottom source/drain plug 150.

The bottom source/drain contact hole 10 is configured to provide space for forming the bottom source/drain plug.

In some implementations, the bottom dielectric layer 140 above the source/drain doped layer 130 is etched using the (anisotropic) dry etching process. The anisotropic dry etching process has anisotropic etching characteristics, thereby being beneficial to improve profile controllability of the bottom source/drain contact hole 10.

The initial plug 151 is configured to form the bottom source/drain plug after etching back. Etching back the part of the thickness of the initial plug 151 makes the top surface of the bottom source/drain plug be lower than the top surface of the gate cap layer 115, thereby reserving a space for forming the source/drain cap layer.

In some implementations, the part of the thickness of the initial plug 151 is etched back by using the dry etching process.

As shown in FIG. 9, a part of a thickness of the spacer 120 is etched back, to expose a part of a side wall of the gate cap layer 115. The part of the thickness of the spacer 120 is etched back, so that the top surface of the spacer 120 is lower than the top surface of the gate cap layer 115, to provide a space for subsequently forming an etching barrier layer on the side wall of the gate cap layer 115.

In an example, in the process of forming the bottom source/drain contact hole 10, the part of the thickness of the spacer 120 is etched back. In some implementations, in the process of etching back the part of the thickness of the initial plug 151, the initial plug 151 above the top surface of the spacer 120 is removed.

In some implementations, after the part of the thickness of the spacer 120 is etched back, and the bottom source/drain plug 150 is formed, the top surface of the bottom source/drain plug 150 is flush with the top surface of the spacer 120. In other implementations, in the process of etching back the part of the thickness of the initial plug, the part of the thickness of the spacer may be further etched back.

In an example, after the part of the thickness of the spacer 120 is etched back, and the initial plug 151 is formed, the spacer 120 further covers a part of a side wall of the gate cap layer 115, that is, the top surface of the spacer 120 is lower than the top surface of the gate cap layer 115, and is higher than the top surface of the gate structure 110.

In other implementations, the top surface of the spacer may alternatively be lower than the top surface of the gate structure. The top surface of the spacer is further lower than the top surface of the gate structure. Therefore, in the subsequent process of forming the etching barrier layer, the etching barrier layer can further cover a part of the side wall of the gate structure, that is, a part of the etching barrier layer is located between the bottom source/drain plug and the gate structure, thereby helping further improve the protection effect of the etching barrier layer on the spacer, the isolation effect between the bottom source/drain plug and the subsequent gate plug, and the isolation effect between the top source/drain plug and the gate structure.

It should be noted that, in some implementations, the bottom source/drain plug 150 is in contact with a part of the source/drain doped layer 130, and after the bottom source/drain plug 150 is formed, and the part of the thickness of the spacer 120 is etched back, a trench 50 is formed in the bottom dielectric layer 140. A side wall of the trench 50 exposes the gate cap layer 115, and a bottom of the trench 50 exposes the bottom source/drain plug 150 and the spacer 120.

Figure 12:
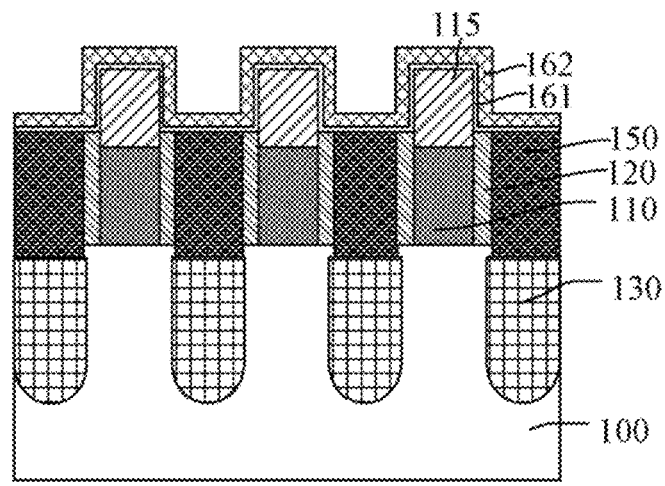
Figure 13:
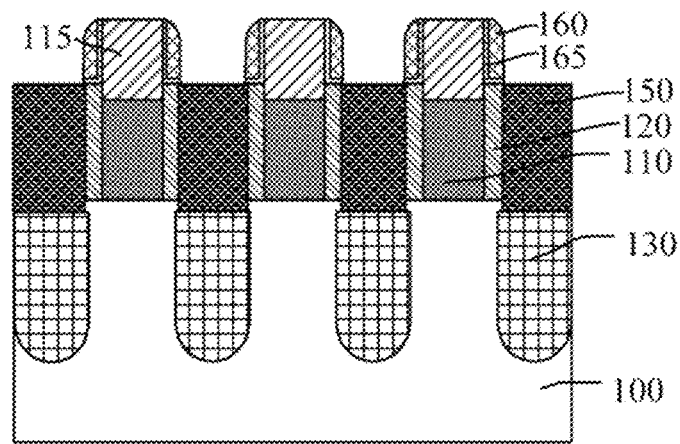

As shown in FIG. 12 and FIG. 13, the etching barrier layer 160 is formed on the side wall of the gate cap layer 115 exposed by the bottom source/drain plug 150. In some implementations, the etching barrier layer 160 is formed on an inner side wall of the trench 50.

In an example, an adhesion layer 165 located on the side wall of the gate cap layer 115 and the top surface of the spacer is further formed in the step of forming the etching barrier layer 160. Correspondingly, the etching barrier layer 160 covers the adhesion layer 165 located on the top surface of the spacer 120 and the side wall of the gate cap layer 115.

In an example, the steps of forming the etching barrier layer 160 and the adhesion layer 165 include: as shown in FIG. 12, forming an adhesion film 161 conformally covering the bottom source/drain plug 150, the top surface of the spacer 120, and the top surface and side wall of the gate cap layer 115, and an etching barrier film 162 conformally covering the adhesion film 161; and as shown in FIG. 13, removing an etching barrier film 162 located above the bottom source/drain plug 150 and the top surface of the gate cap layer 115, and the adhesion film 161 exposed by the etching barrier film 162 located on the side wall of the gate cap layer 115, where the adhesion film 161 located on the side wall of the gate cap layer 115 and the top surface of the spacer 120 is used as the adhesion layer 165, and the etching barrier film 162 covering the adhesion layer 165 located on the top surface of the spacer 120 and the side wall of the gate cap 115 is used as the etching barrier layer 160.

In some implementations, the adhesion film 161 is formed using an atomic layer deposition process, thereby being beneficial to improve the thickness uniformity and density of the adhesion film 161, and form a thinner adhesion film 161, so as to facilitate smaller thickness of the adhesion layer.

In some implementations, the etching barrier film 162 is formed using the atomic layer deposition process. The atomic layer deposition process includes performing a plurality of atomic layer deposition cycles, to form a thin film with required thickness. Selecting the atomic layer deposition process helps improve the thickness uniformity and density of the etching barrier film 162, and correspondingly improve the hardness of the etching barrier film 162, with the effect that the etching barrier layer is configured to define the lateral etching stop position is improved, and the thickness of the etching barrier film 162 can be precisely controlled. In addition, good gap filling performance and step coverage of the atomic layer deposition process correspondingly improve conformal coverage capability of the etching barrier film 162, thereby improving the forming quality of the etching barrier film 162.

In some implementations, the etching barrier film 162 located above the bottom source/drain plug 150 and the top surface of the gate cap layer 115, and the adhesion film 161 exposed by the etching barrier film 162 located on the side wall of the gate cap layer 115 are removed by using the anisotropic etching process. The anisotropic etching process has a low lateral etching rate on the etching barrier film 162 located on the side wall of the gate cap layer 115, so that the etching barrier film 162 located above the bottom source/drain plug 150 and the top surface of the gate cap layer 115, and the adhesion film 161 exposed by the etching barrier film 162 located on the side wall of the gate cap layer 115 can be removed in a maskless environment, and the etching barrier film 162 located on the side wall of the gate cap layer 115 can be reserved as the etching barrier layer 160, where the adhesion film 161 located on the side wall of the gate cap layer 115 and the top surface of the spacer 120 is reserved under the coverage of the etching barrier layer 160, so as to form the adhesion layer 165. In addition, etching the etching barrier film 162 and the adhesion film 161 in the maskless environment helps save process costs.

Figure 14:
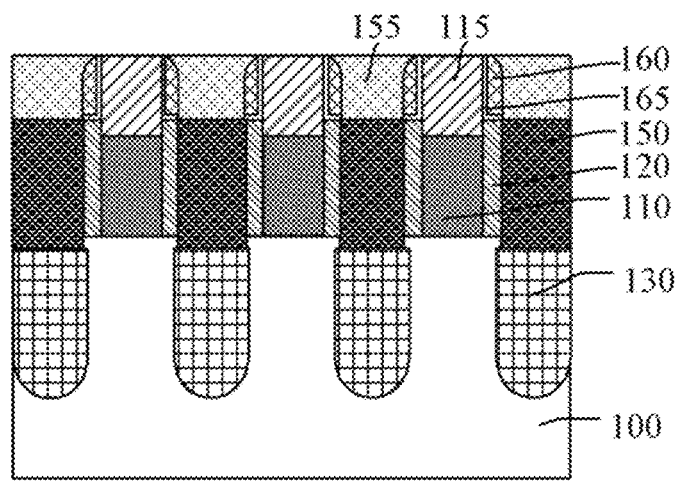

As shown in FIG. 14, a source/drain cap layer 155 covering the side wall of the etching barrier layer 160 is formed on the top surface of the bottom source/drain plug 150.

In some implementations, the step of forming the source/drain cap layer 155 includes: forming a source/drain cap material layer (not shown in the figure) covering the side wall of the etching barrier layer 160 on the bottom source/drain plug 150, where the source/drain cap material layer further covers the gate cap layer 115; and removing a source/drain cap material layer above the top surface of the gate cap layer 115, to form the source/drain cap layer 155.

The source/drain cap material layer is formed by using the deposition process, for example, the CVD process. In some implementations, the source/drain cap material layer above the top surface of the gate cap layer 115 is removed by using the planarization process, for example, the CMP process.

In some implementations, after the bottom source/drain plug 150, the source/drain cap layer 155, the gate cap layer 115, and the etching barrier layer 160 are formed, the top surfaces of the bottom source/drain plug 150, the source/drain cap layer 155, the gate cap layer 115, and the etching barrier layer 160 are flush.

Figure 15:
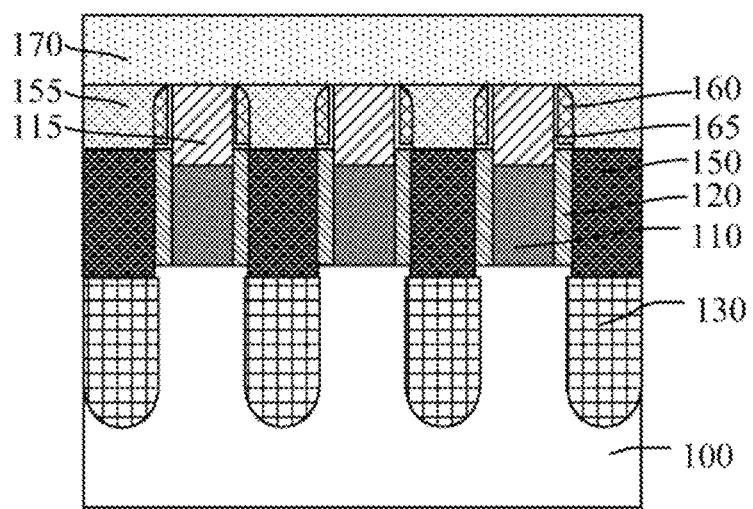

Referring to FIG. 15, a top dielectric layer 170 covering the gate cap layer 115, the source/drain cap layer 155, and the etching barrier layer 160 is formed on the bottom dielectric layer 140.

The top dielectric layer 170 is configured to implement subsequent electrical isolation between the gate plug and the top source/drain plug from the bottom dielectric layer 120. A material of the top dielectric layer 170 is a dielectric material, for example, one or more of silicon oxide, silicon nitride, silicon oxynitride, silicon oxycarbide, carbonitride and silicon oxycarbonitride.

The top dielectric layer 170 is formed using the deposition process, for example, the CVD process.

Figure 16:
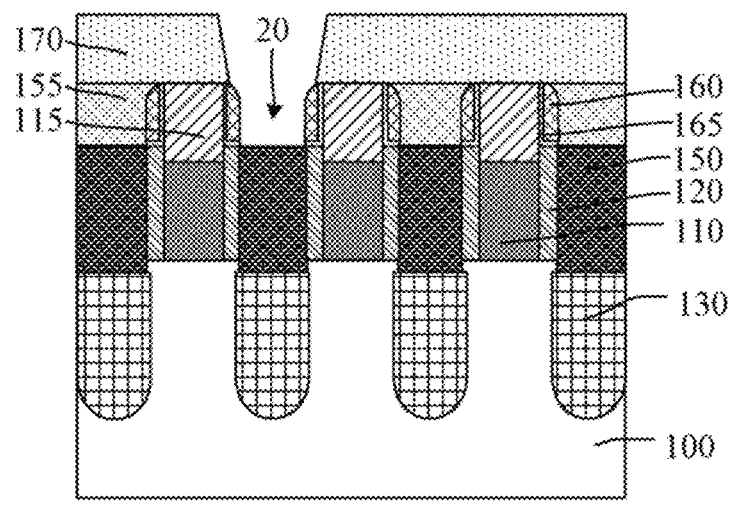
Figure 17:
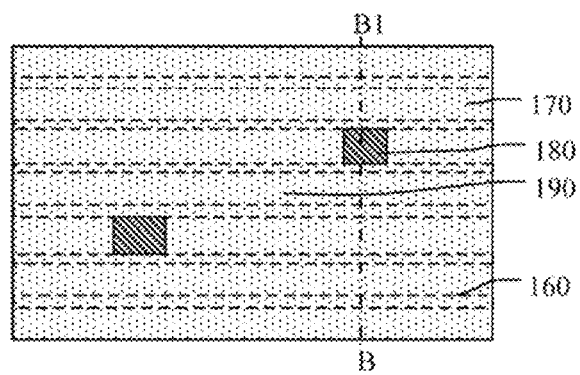
Figure 18:
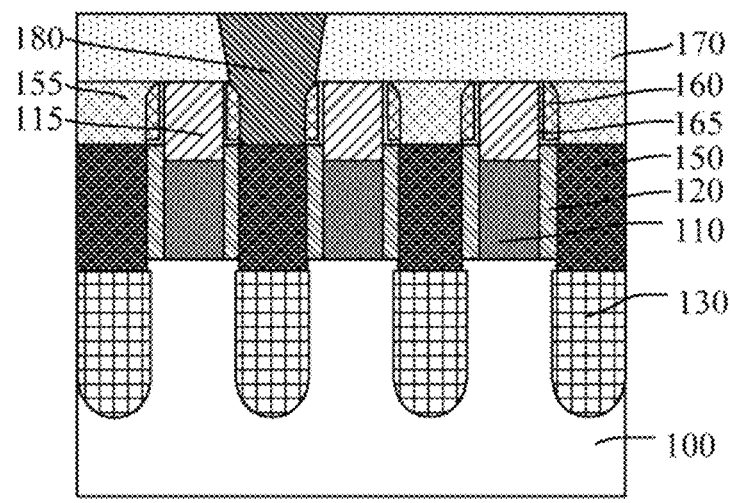

Referring to FIG. 16 to FIG. 18, a top source/drain plug 180 that runs through the source/drain cap layer 155 and the top dielectric layer 170 and that is in contact with the bottom source/drain plug 150 is formed.

The top source/drain plug 180 and the bottom source/drain plug 150 form a source/drain plug, thereby implementing an electrical connection between the source/drain plug 130 and an external circuit or other interconnection structures.

In some implementations, a material of the top source/drain plug 180 is copper. The copper has a lower resistivity, thereby being beneficial to alleviate a signal delay of a back-end RC, improve a processing speed of the chip, further reduce resistance of the top source/drain plug 180, and correspondingly reduce power consumption. In other implementations, the material of the top source/drain plug may alternatively be a conductive material such as tungsten or cobalt.

A direction parallel to the base 100 and perpendicular to an extension direction of the gate structure 110 is a lateral direction. In some implementations, the step of forming the top source/drain plug 180 includes: as shown in FIG. 16, etching the top dielectric layer 170 and the source/drain cap layer 155 above the bottom source/drain plug 150 using the etching barrier layer 160 as a lateral etching stop position, to form a top source/drain contact hole 20 exposing the bottom source/drain plug 150; and as shown in FIG. 17 and FIG. 18, forming the top source/drain plug 180 filled in the top source/drain contact hole 20, where FIG. 17 is a top view, and FIG. 18 is a cross-sectional view OF FIG. 17 at a position B-B1.

In some implementations, the etching barrier layer 160 covering the top surface of the spacer 120 is further formed between the gate cap layer 115 and the source/drain cap layer 155. In the process of forming the top source/drain contact hole 20, the etching barrier layer 160 can define the lateral etching stop position, and the etching barrier layer 160 can protect the spacer 120, thereby helping reduce the probability that the spacer 120 is mistakenly etched by using the etching process of forming the top source/drain contact hole 20. Moreover, the etching barrier layer 160 can further isolate the top source/drain plug 180 from the gate structure 110. Both of the two aspects help prevent the problem of bridging or breakdown between the top source/drain plug 180 and the gate structure 110 at the top corner of the spacer 120.

The top source/drain contact hole 20 is configured to provide space for forming the top source/drain plug.

In some implementations, the top dielectric layer 170 and the source/drain cap layer 155 above the bottom source/drain plug 150 are etched using the dry etching process. The dry etching process has relatively high profile controllability, thereby being beneficial to improve profile quantity of the top source/drain contact hole 20.

In some implementations, the step of forming the top source/drain plug 180 filled in the top source/drain contact hole 20 includes: forming a first conductive layer (not shown in the figure) that is filled in the top source/drain contact hole 20 and that covers the top dielectric layer 170; and removing the first conductive layer above the top surface of the top dielectric layer 170, where the first conductive layer in the top source/drain contact hole 20 is used as the top source/drain plug 180.

In some implementations, a process of forming the first conductive layer includes one or more of an electrochemical plating process, a physical vapor deposition process, and a chemical vapor deposition process. In some implementations, the first conductive layer above the top surface of the top dielectric layer 170 is removed by using the planarization process, for example, the CMP process.

Figure 19:
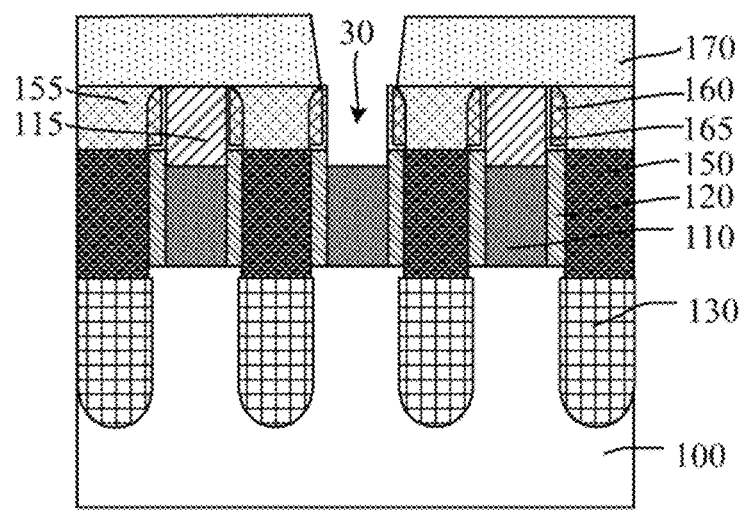
Figure 20:
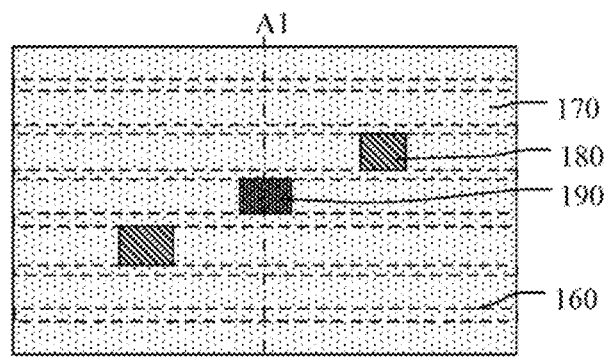
Figure 21:
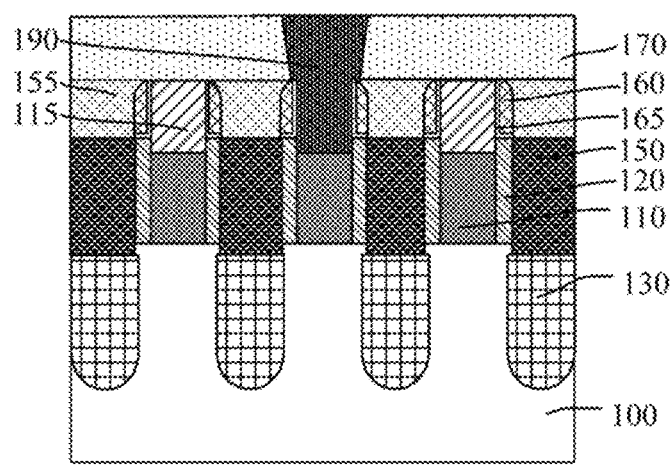

Referring to FIG. 19 to FIG. 21, FIG. 19 is a cross-sectional view, FIG. 20 is a top view, and FIG. 21 is a cross-sectional view of FIG. 20 at a position A-A1. A gate plug 190 that runs through the gate cap layer 115 and the top dielectric layer 170 and that is in contact with the gate structure 110 is formed. The gate plug 190 is configured to implement an electrical connection between the gate structure 110 and an external circuit or other interconnection structures.

In some implementations, the gate plug 190 is in contact with the gate structure 110 of the AA, that is, the gate plug 190 is the COAG. Compared with the solution that the gate plug is in contact with a gate structure located in an isolation area, the gate plug 190 is formed above the gate structure 110 in the AA. Therefore, a part of the gate structure 110 located in the isolation area is omitted, which helps save the area of the chip, thereby further reducing the size of the chip.

In some implementations, a material of the gate plug 190 is copper. The copper has a lower resistivity, thereby being beneficial to alleviate a signal delay of a back-end RC, improve a processing speed of the chip, further reduce resistance of the gate plug 190, and correspondingly reduce power consumption. In other implementations, the material of the gate plug may alternatively be a conductive material such as tungsten or cobalt.

In some implementations, the step of forming the gate plug 190 includes: as shown in FIG. 19, etching the top dielectric layer 170 and the gate cap layer 115 above the gate structure 110 using the etching barrier layer 160 as a lateral etching stop position, to form a gate contact hole 30 exposing the gate structure 110; and as shown in FIG. 20 and FIG. 21, forming the gate plug 190 filled in the gate contact hole 30, where FIG. 20 is a top view, and FIG. 21 is a cross-sectional view of FIG. 20 at a position B-B1.

In the process of forming the gate contact hole 30, the etching barrier layer 160 can define the lateral etching stop position, and the etching barrier layer 160 can protect the spacer 120, thereby helping reduce the probability that the spacer 120 is mistakenly etched by the etching process of forming the gate contact hole 30, further prevent the problem of bridging or breakdown between the gate plug 190 and the bottom source/drain plug 150 at the top corner of the spacer 120, and improve the performance and production manufacturing yield of the semiconductor structure.

The gate contact hole 30 is configured to provide space for forming the gate plug 190. In some implementations, the top dielectric layer 170 and the gate cap layer 115 above the gate structure 110 are etched using the dry etching process.

In some implementations, the step of forming the gate plug 190 filled in the gate contact hole 30 includes: filling a second conductive layer (not shown in the figure) in the gate contact hole 30, where the second conductive layer is further located on the top dielectric layer 170; and removing the second conductive layer above the top surface of the top dielectric layer 170, where a remaining second conductive layer in the gate contact hole 30 is used as the gate plug 190.

In some implementations, for example, after the top source/drain plug 180 is formed, the gate plug 190 is formed. However, the steps of forming the top source/drain plug and the gate plug are not limited in the present disclosure. For example, in other implementations, after the gate plug is formed, the top source/drain plug may be further formed. In some other implementations, alternatively, the gate contact hole and the top source/drain contact hole may be first formed in different steps respectively, and the conductive materials are then filled in the gate contact hole and the top source/drain contact hole in the same step, to form the gate plug located in the gate contact hole and the top source/drain plug located in the top source/drain contact hole.

FIG. 22 to FIG. 26 are schematic structural diagrams corresponding to steps in another form of a forming method of a semiconductor structure according to the present disclosure. Similarities between the present embodiment and implementations and the foregoing embodiments and implementations are not described herein again. Differences between the present embodiment and implementations and the foregoing embodiments and implementations are as follows: the step of forming the bottom source/drain plug, the source/drain cap layer, the gate cap layer, and the etching barrier layer includes: forming the etching barrier layer on the side wall of the source/drain cap layer after the bottom source/drain plug and the source/drain cap layer are formed; and forming the gate cap layer covering the side wall of the etching barrier layer on the top surface of the gate structure.

Forms of the specific steps of forming the bottom source/drain plug, the source/drain cap layer, the gate cap layer, and the etching barrier layer are described in detail below with reference to the accompanying drawings.

Figure 22:
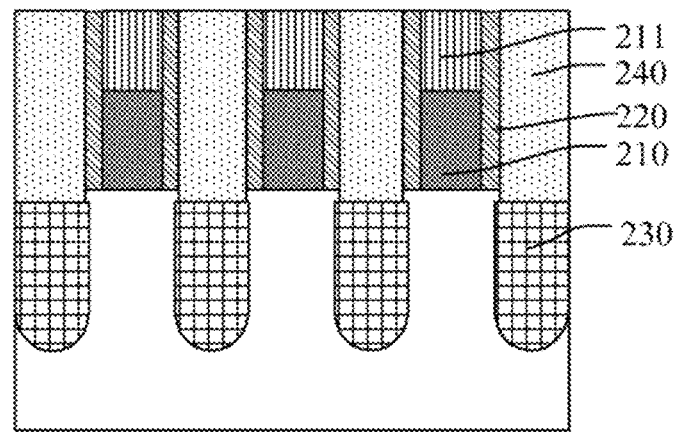
FIG. 22 to FIG. 26 are schematic structural diagrams corresponding to steps in another form of a forming method of a semiconductor structure according to the present disclosure.

As shown in FIG. 22, a part of a thickness of a gate structure 210 is etched back, and a sacrificial cap layer 211 is formed on a top surface of the gate structure 210. A spacer 220 covers side walls of the gate structure 210 and the sacrificial cap layer 211.

The step of etching back the part of the thickness of the gate structure 210 is the same as that of the foregoing embodiments. Details are not described herein again. The sacrificial cap layer 211 is configured to occupy space for subsequently forming the gate cap layer.

For a forming process and a material of the sacrificial cap layer 211, reference may be made to related descriptions of the gate cap layer in the foregoing embodiments. Details are not described herein again.

Figure 23:
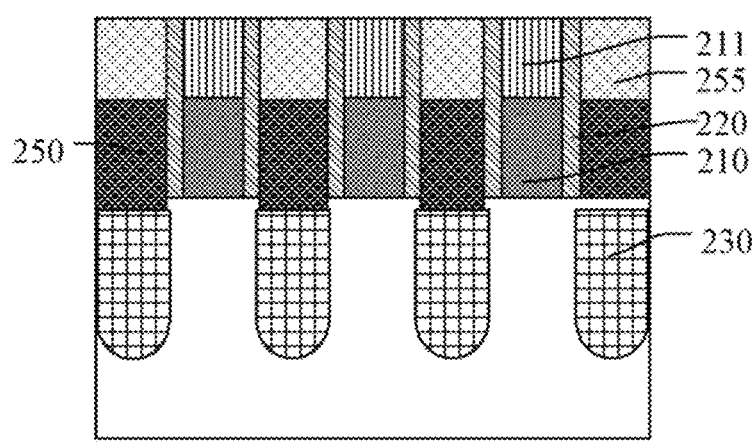

As shown in FIG. 23, a bottom source/drain plug 250 running through a bottom dielectric layer 240 above a source/drain doped layer 230, and a source/drain cap layer 255 located on the bottom source/drain plug 250 are formed, where side walls of the bottom source/drain plug 250 and the source/drain cap layer 255 are in contact with a side wall of the spacer 220.

In some implementations, the source/drain cap layer 255 is formed after the bottom source/drain plug 250 is formed.

The step of forming the bottom source/drain plug 250 in the present embodiment and implementations is the same as that in the foregoing embodiments and implementations. Details are not described herein again.

For a forming step and a material of the source/drain cap layer 255, reference may be made to related descriptions of the foregoing embodiments. Details are not described again.

Figure 24:
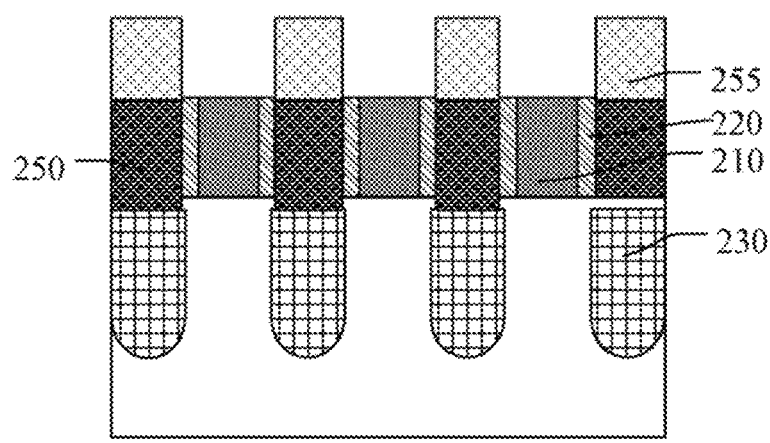

As shown in FIG. 24, the sacrificial cap layer 211 and the spacer 220 on the side wall of the sacrificial cap layer 211 are removed, to expose the top surface of the gate structure 210 and the side wall of the source/drain cap layer 255.

The top surface of the gate structure 210 and the side wall of the source/drain cap layer 255 are exposed, to make preparation for subsequently forming an etching barrier layer on the side wall of the source/drain cap layer 255 and forming a gate cap layer on the top surface of the gate structure 210.

In an example, the sacrificial cap layer 211 and the spacer 220 on the side wall of the sacrificial cap layer 211 are removed using a process of a combination of dry etching and wet etching.

Figure 25:
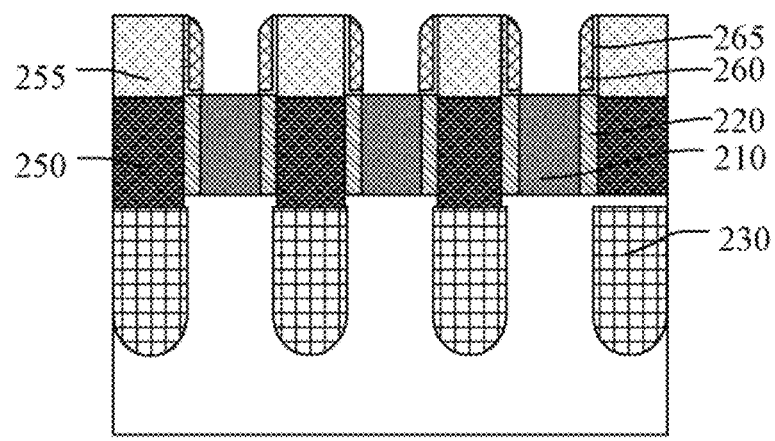

As shown in FIG. 25, an etching barrier layer 260 covering the top surface of the spacer 220 is formed on the side wall of the source/drain cap layer 255.

The forming method of a semiconductor structure further includes: in the step of forming the etching barrier layer 260, further forming an adhesion layer 265 located on the side wall of the source/drain cap layer 255 and the top surface of the spacer 220, where the etching barrier layer 260 covers the adhesion layer 265 located on the top surface of the spacer 220 and the side wall of the source/drain cap layer 255.

For related descriptions of forming the etching barrier layer 260 and the adhesion layer 265, reference may be made to detailed descriptions of forming the etching barrier layer and the adhesion layer in the foregoing embodiments. Details are not described herein again.

Figure 26:
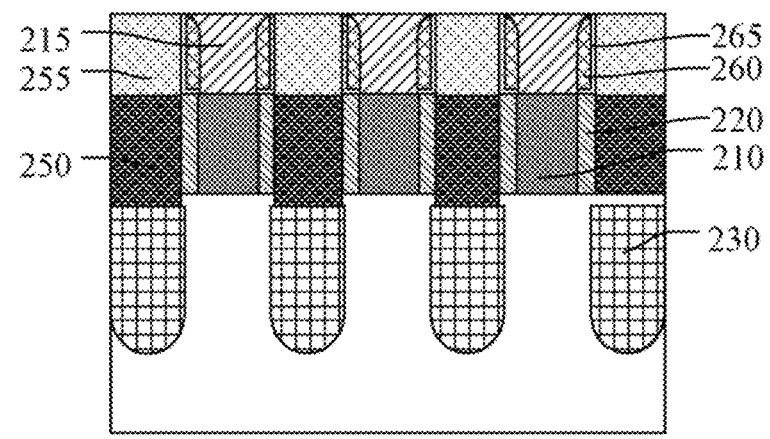

As shown in FIG. 26, a gate cap layer 215 covering the side wall of the etching barrier layer 260 is formed on the top surface of the gate structure 210.

For the step of forming the gate cap layer 215, reference may be made to related descriptions of the foregoing embodiments and implementations. Details are not described herein again. The subsequent steps are the same as those of the foregoing embodiments and implementations. Details are not described herein again in the present embodiment.

For detailed descriptions of the forming method of a semiconductor structure in the present embodiment and implementations, reference may be made to corresponding descriptions in the foregoing embodiments and implementations. Details are not described herein again in the present embodiment.

FIG. 27 to FIG. 36 are schematic structural diagrams corresponding to steps in still another form of a forming method of a semiconductor structure according to the present disclosure. Similarities between the present embodiment and implementations and the foregoing embodiments and implementations are not described herein again, and differences between the present embodiment and implementations and the foregoing embodiments and implementations are as follows: the base includes a first device unit area and a second device unit area; the gate cap layer includes a first gate cap layer located in the first device unit area and a second gate cap layer located in the second device unit area; the etching barrier layer includes a first etching barrier layer located in the first device unit area and a second etching barrier layer located in the second device unit area; the first etching barrier layer is formed on a side wall of the first gate cap layer, and covers the top surface of the spacer; a source/drain cap layer of the first device unit area covers a side wall of the first etching barrier layer; the second etching barrier layer is formed on a side wall of the source/drain cap layer in the second device unit area, and covers the top surface of the spacer; and the second gate cap layer covers a side wall of the second etching barrier layer.

The steps of forming the bottom source/drain plug, the source/drain cap layer, the gate cap layer, and the etching barrier layer in the present embodiment and implementations are described in detail below with reference to the accompanying drawings.

Figure 27:
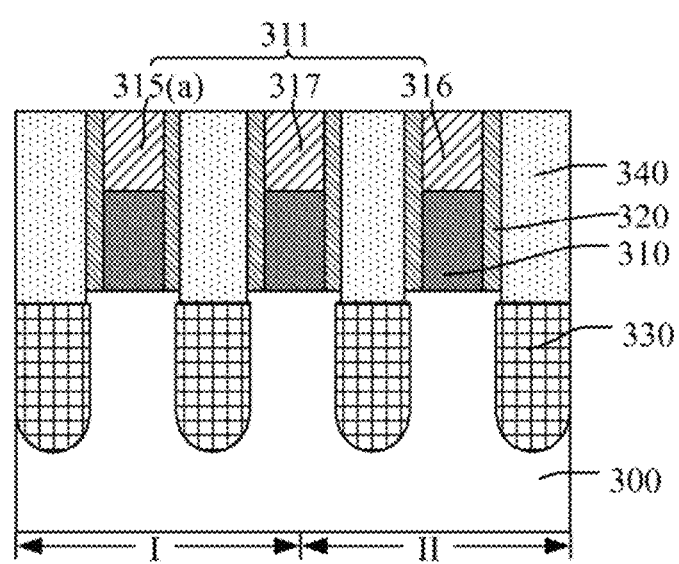
FIG. 27 to FIG. 36 are schematic structural diagrams corresponding to steps in still another form of a forming method of a semiconductor structure according to the present disclosure.

As shown in FIG. 27, a part of a thickness of a gate structure 310 is removed, and an initial cap layer 311 is formed on the top surface of the gate structure, and includes a first gate cap layer 315a located in a first device unit area I and a sacrificial cap layer 316 located in a second device unit area II.

The part of the thickness of the gate structure 310 is removed to reserve a space for forming the initial cap layer 311.

The step of removing the part of the thickness of the gate structure 310 is the same as that of the foregoing embodiments and implementations. Details are not described herein again. The first gate cap layer 315a is configured to protect the top surface of the gate structure 310.

The sacrificial cap layer 316 is configured to occupy space for forming the second gate cap layer.

In some implementations, the gate structure 310 is further formed on a base 300 at a junction between the first device unit area I and the second device unit area II. In the process of forming the initial cap layer 311, the initial cap layer 311 further includes an isolation cap layer 317 located on the top surface of the gate structure 310 at the junction of the first device unit area I and the second device unit area II.

Subsequently, the gate structure 310 and the isolation cap layer 317 at the junction of the first device unit area I and the second device unit area II are further removed, to form an isolation structure on the base 300 at the junction of the first device unit area I and the second device unit area II. The isolation structure is configured to isolate the first device unit area I from the second device unit area II. The isolation structure may be a single diffusion barrier (SDB) isolation structure.

For the step of forming the initial cap layer 311, reference may be made to related descriptions of forming the gate cap layer in the foregoing embodiments. Details are not described herein again.

As shown in FIG. 28 to FIG. 36, a part of a height of a spacer 320 in the first device unit area I is etched back, to expose a side wall of the first gate cap layer 315a; and a bottom source/drain plug 350 running through a bottom dielectric layer 340 above a source/drain doped layer 330 and a first etching barrier layer 360a on the side wall of the first gate cap layer 315a exposed by the bottom source/drain plug 350 are formed, where a top surface of the bottom source/drain plug 350 is lower than top surfaces of the first gate cap layer 315a and the sacrificial cap layer 316.

The part of the height of the spacer 320 in the first device unit area I is etched back, to expose the side wall of the first gate cap layer 315a, so as to reserve a space for forming the first etching barrier layer on the side wall of the first gate cap layer 315a.

In some implementations, in the process of forming the bottom source/drain plug 350, the part of the height of the spacer 320 in the first device unit area I is etched back.

Figure 28:
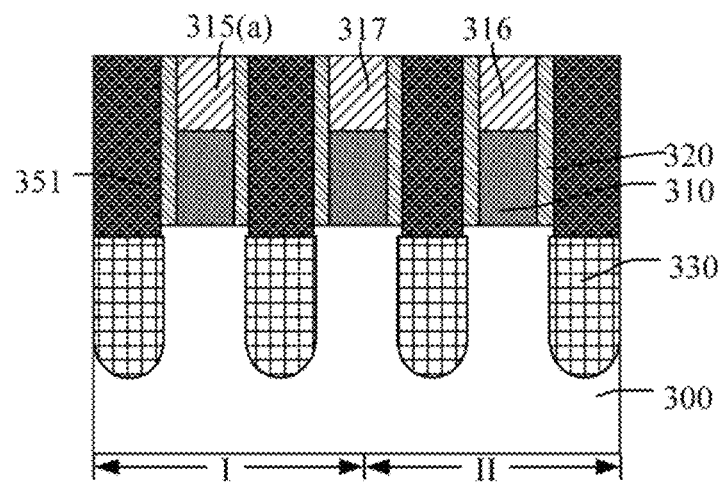
Figure 29:
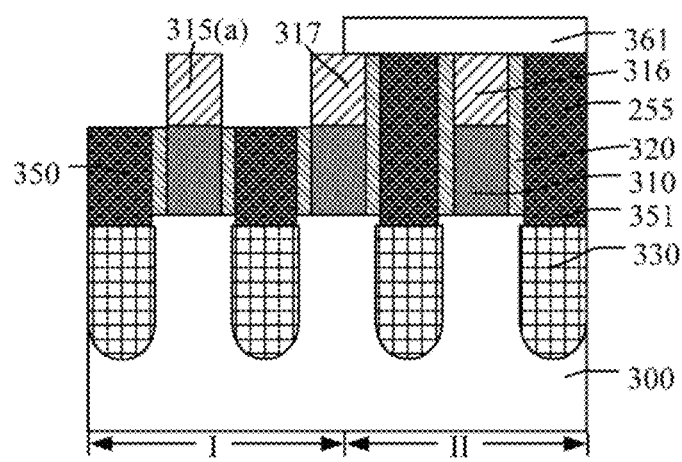
Figure 30:
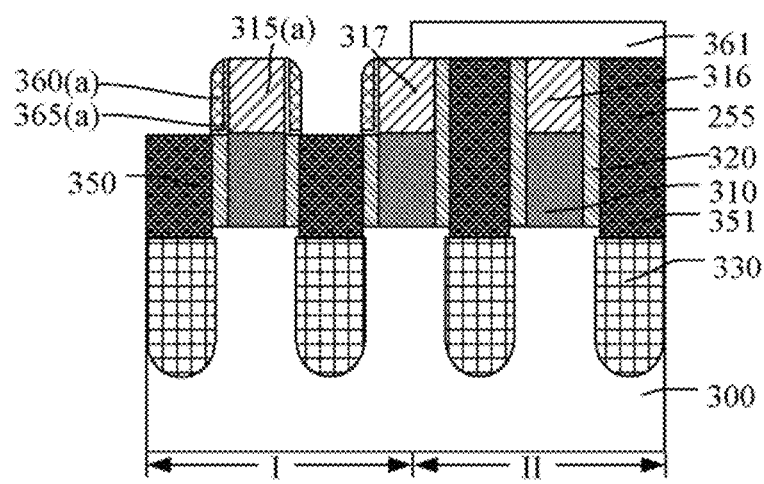
Figure 31:
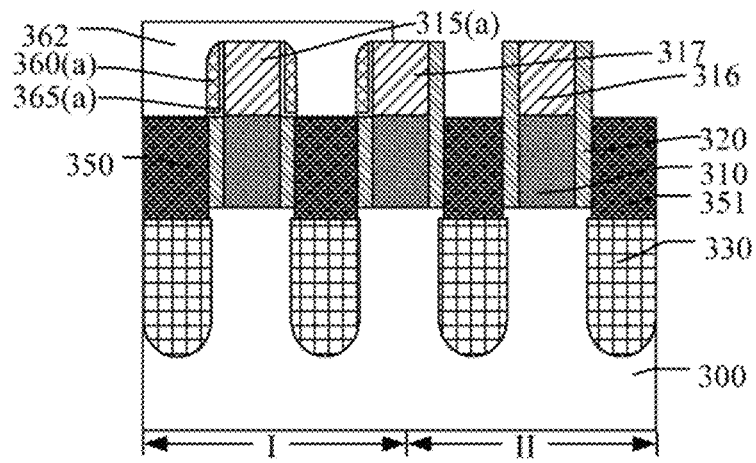

In some implementations, the step of forming the bottom source/drain plug 350 includes: etching the bottom dielectric layer 340 above the source/drain doped layer 330, to form a bottom source/drain contact hole (not shown in the figure) exposing the source/drain doped layer 330; forming an initial plug 351 (as shown in FIG. 28) in the bottom source/drain contact hole, where a top surface of the initial plug 351 is flush with the top surface of the first gate cap layer 315a; and as shown in FIG. 29 to FIG. 31, etching back a part of a thickness of the initial plug 351, to form the bottom source/drain plug 350.

In some implementations, the bottom dielectric layer 340 above the source/drain doped layer 330 of the first device unit area I and the second device unit area II is etched, to form the bottom source/drain contact holes. Correspondingly, the initial plugs 351 are formed in the bottom source/drain contact holes of the first device unit area I and the second device unit area II.

In some implementations, in the process of etching back the part of the thickness of the initial plug 351, the part of the height of the spacer 320 in the first device unit area I is etched back. Correspondingly, in some implementations, in different steps, the initial plugs 351 of the first device unit area I and the second device unit area II are etched back.

In an example, after the initial plug 351 of first device unit area I is etched back, the part of the height of the spacer 320 in the first device unit area I is etched back, and the first etching barrier layer 360a is formed, the initial plug 351 of the second device unit area II is etched back.

Correspondingly, as shown in FIG. 29, in the step of etching back the initial plug 351 of the first device unit area I, and etching back the part of the height of the spacer 320 in the first device unit area I, a first mask layer 361 covering the initial plug 351, the sacrificial cap layer 316, and the spacer 320 of the second device unit area II further needs to be formed. The first mask layer 361 is configured to prevent the steps of etching back the initial plug 351 of the first device unit area I, etching back the part of the height of the spacer 320 in the first device unit area I, and forming the first etching barrier layer 360a from affecting the second device unit area II.

A material of the first mask layer 361 includes photoresist. The first mask layer 361 may be formed through photolithography processes such as photoresist coating, exposure, and development.

It should be noted that, as shown in FIG. 30, in some implementations, the forming method of a semiconductor structure further includes: in the process of forming the first etching barrier layer 360a, further forming a first adhesion layer 365a located on the side wall of the first gate cap layer 315a and the top surface of the spacer 320 in the first device unit area I, where the first etching barrier layer covers the first adhesion layer 365a located on the top surface of the spacer and the side wall of the first gate cap layer.

For specific steps of forming the first etching barrier layer 360a and the first adhesion layer 365a, reference may be made to related descriptions in the foregoing embodiments and implementations. Details are not described herein again.

Correspondingly, after the initial plug 351 of the first device unit area I is etched back, the part of the height of the spacer 320 in the first device unit area I is etched back, and the first etching barrier layer 360a is formed, the first mask layer 361 is removed. Specifically, the first mask layer 361 is removed by using an ashing process and a wet stripping process sequentially.

As shown in FIG. 31, after the first mask layer 361 is removed, a second mask layer 362 that covers the bottom source/drain plug 350, the first gate cap layer 315a and the first etching barrier layer 360a of the first device unit area I and that exposes the second device unit area II further needs to be formed, and is configured to prevent the step of etching back the initial plug 351 of the second device unit area II from affecting the first device unit area I.

After the initial plug 351 of the second device unit area II is etched back, the second mask layer 362 is removed.

The second mask layer is removed to make preparation for subsequent processes. For a material, a forming process, and a removal process of the second mask layer 362, reference may be made to related descriptions of the first mask layer 361 in the foregoing embodiments. Details are not described herein again.

However, a sequence of etching back the initial plugs 351 of the first device unit area I and the second device unit area II in the present disclosure is not limited to that of the foregoing steps.

For example, in other implementations, after the initial plug of the second device unit area is etched back, the initial plug of the first device unit area may be further etched back. Correspondingly, in some implementations, in the process of etching back the initial plug of the first device unit area, the part of the height of the spacer in the first device unit area is etched back; and after the part of the height of the spacer in the first device unit area is etched back, the first etching barrier layer covering the top surface of the spacer is formed on the side wall of the first gate cap layer.

In some other implementations, in the same step, the initial plugs of the first device unit area and the second device unit area may be further etched back.

Correspondingly, after the initial plugs of the first device unit area and the second device unit area are etched back, the mask layer in the second device unit area is formed. Then, the part of the height of the spacer in the first device unit area is etched back. The first etching barrier layer covering the side wall of the first gate cap layer and the top surface of the spacer is formed on the top surface of the bottom source/drain plug in the first device unit area.

Figure 32:
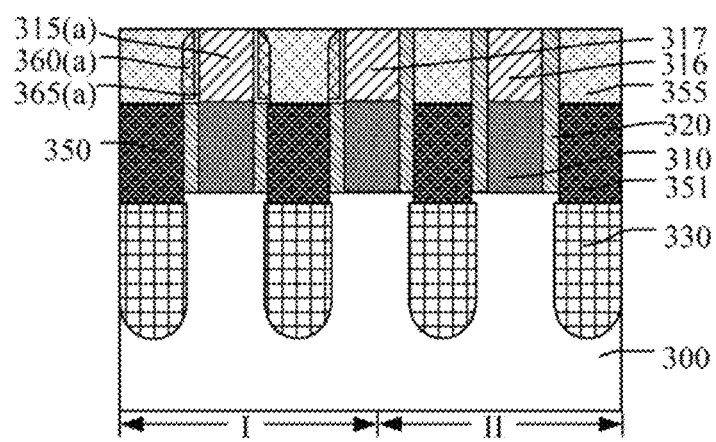

As shown in FIG. 32, a source/drain cap layer 355 is formed on the top surface of the bottom source/drain plug 350. The source/drain cap layer 355 of the first device unit area I covers the side wall of the first etching barrier layer 360a, and the source/drain cap layer 355 of the second device unit area II covers the side wall of the spacer 320. For the step of forming the source/drain cap layer 355, reference may be made to related descriptions of the source/drain cap layer in the foregoing embodiments. Details are not described herein again.

Figure 33:
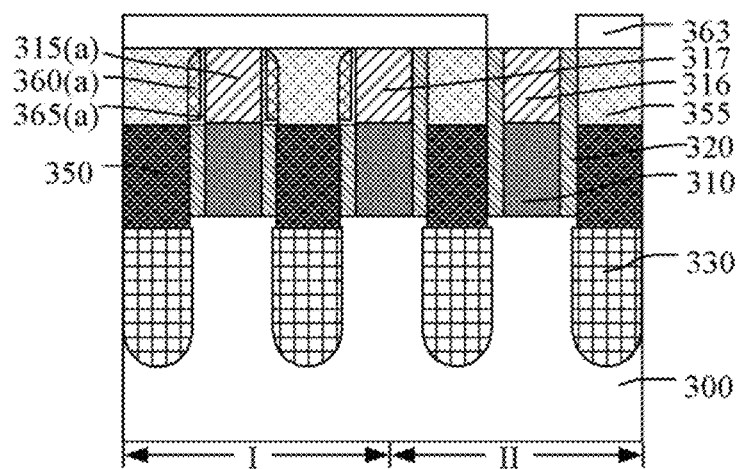
Figure 34:
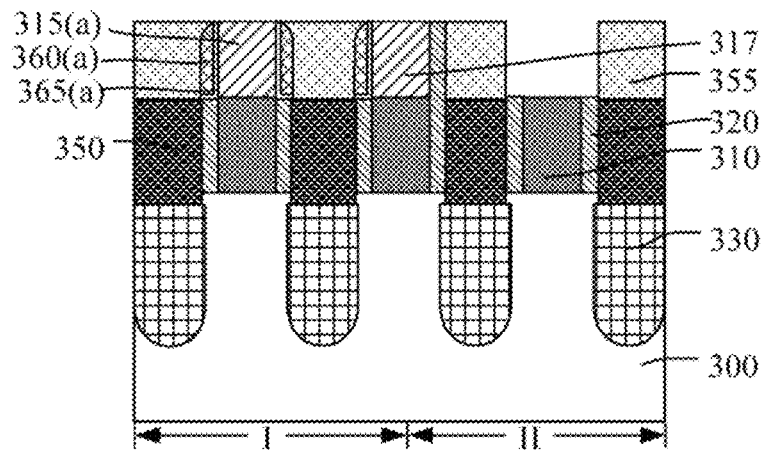

As shown in FIG. 33 and FIG. 34, the sacrificial cap layer 316 and the spacer 320 on the side wall of the sacrificial cap layer 316 are removed, to expose the top surface of the gate structure 310 and the side wall of the source/drain cap layer 355 in the second device unit area II.

In some implementations, the step of removing the sacrificial cap layer 316 and the spacer 320 on the side wall of the sacrificial cap layer 316 includes: as shown in FIG. 32, forming a third mask layer 363 covering the source/drain cap layer, the first etching barrier layer 360a, and the first gate cap layer 315a, where the third mask layer 363 further exposes the sacrificial cap layer 316 and the spacer on the side wall of the sacrificial cap layer 316 in the second device unit area II; as shown in FIG. 33, removing the sacrificial cap layer 316 and the spacer 320 on the side wall of the sacrificial cap layer 316 using the third mask layer 363 as a mask; and removing the third mask layer 363.

For a material and a forming process of the third mask layer 363, reference may be made to related descriptions of the first mask layer 361 described above. Details are not described herein again. For the step of a specific process of removing the sacrificial cap layer 316 and the spacer 320 on the side wall of the sacrificial cap layer 316, reference may be made to related descriptions of the foregoing embodiments. Details are not described herein again. For a process of removing the third mask layer 363, reference may be made to related descriptions of removing the first mask layer in the foregoing embodiments. Details are not described again.

Figure 35:
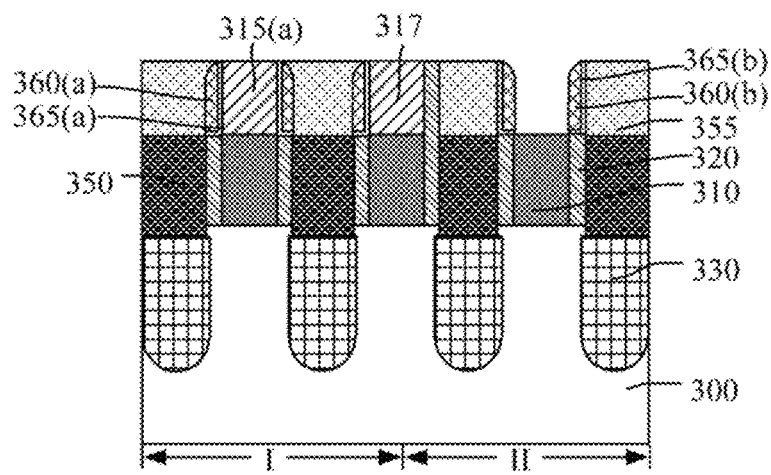

As shown in FIG. 35, a second etching barrier layer 360b is formed on the side wall of the source/drain cap layer 355 in the second device unit area II.

The forming method of a semiconductor structure further includes: in the step of forming the second etching barrier layer 360b, further forming a second adhesion layer 365b located on the side wall of the source/drain cap layer 355 and the top surface of the spacer 320, where the second etching barrier layer 360b covers the second adhesion layer 365b located on the top surface of the spacer 320 and the side wall of the source/drain cap layer 355.

In some implementations, for steps of specific processes of the second etching barrier layer 360b and the second adhesion layer 365b, reference may be made to related descriptions of forming the etching barrier layer and the adhesion layer in the foregoing embodiments and implementations. Details are not described herein again in the present embodiment and implementations. For the step of forming the second etching barrier layer 360b, reference may be made to corresponding descriptions of forming the etching barrier layer in the foregoing embodiments and implementations. Details are not described herein again.

Figure 36:
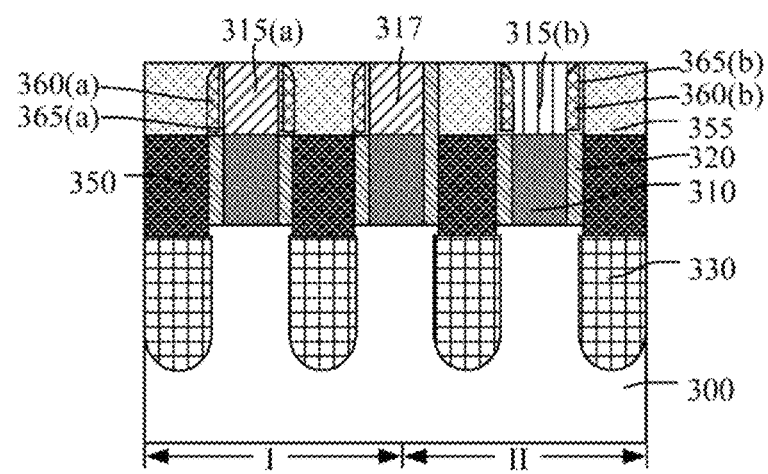

As shown in FIG. 36, a second gate cap layer 315b is formed on the top surface of the gate structure 310 in the second device unit area II, to cover the side wall of the second etching barrier layer 360b. For the step of a specific process of forming the second gate cap layer 315, reference may be made to related descriptions of forming the gate cap layer in the foregoing embodiments. Details are not described herein again.

In some implementations, the first etching barrier layer 360a is formed in the first device unit area I, and the second etching barrier layer 360b is formed in the second device unit area II. That is, in an actual process, according to actual process requirements, the step of forming the etching barrier layer 360 in different device unit areas can be flexibility adjusted, thereby helping improve the flexibility and freedom degree of the process.

The subsequent steps are the same as those of the foregoing embodiments. Details are not described herein again.

For detailed descriptions of the forming method of a semiconductor structure in the present embodiment and implementations, reference may be made to corresponding descriptions in the foregoing embodiments and implementations. Details are not described herein again in the present embodiment.

The present disclosure further provides a semiconductor structure. FIG. 14 is a schematic structural diagram of one form of a semiconductor structure according to the present disclosure.

The semiconductor structure includes: a base 100; a gate structure 110, discretely disposed on the base 100; a spacer 120, located on a side wall of the gate structure 110; a source/drain doped layer 130, located in the base 100 on two sides of the gate structure 110; a bottom dielectric layer 140 (as shown in FIG. 8), located on the two sides of the gate structure 110 and covering the source/drain doped layer 130; a bottom source/drain plug 150, running through the bottom dielectric layer 140 above the source/drain doped layer 130, where a bottom of the bottom source/drain plug 150 is in contact with the source/drain doped layer 130; a gate cap layer 115, located on a top surface of the gate structure 110; a source/drain cap layer 155, located on a top surface of the bottom source/drain plug 150; and an etching barrier layer 160, located between the gate cap layer 115 and the source/drain cap layer 155 and covering a top surface of the spacer 120.

The subsequent steps further include: forming a top dielectric layer covering the gate cap layer 115, the source/drain cap layer 155, and the etching barrier layer 160 on the bottom dielectric layer 140; forming a top source/drain plug that runs through the source/drain cap layer 155 and the top dielectric layer and that is in contact with the bottom source/drain plug 150; and forming a gate plug that runs through the gate cap layer 115 and the top dielectric layer and that is in contact with the gate structure 110.

In the semiconductor structure provided in the present embodiment and implementations of the present disclosure, an etching barrier layer 160 that is located between the gate cap layer 115 and the source/drain cap layer 155 and that covers the top surface of the spacer 120 is further provided. A direction parallel to the base 100 and perpendicular to an extension direction of the gate structure 110 is a lateral direction, and the process of forming the top source/drain plug includes the step of etching the top dielectric layer and the source/drain cap layer 155, to form a top source/drain contact hole exposing the bottom source/drain plug 150. By providing the etching barrier layer 160, in the process of forming the top source/drain contact hole, the etching barrier layer 160 can define a lateral etching stop position, and the etching barrier layer 160 can protect the spacer 120, thereby helping reduce a probability that the spacer 120 is mistakenly etched by using the etching process of forming the top source/drain contact hole. Moreover, the etching barrier layer 160 can further isolate the top source/drain plug from the gate structure 110. Both of the two aspects help prevent a problem of bridging or breakdown between the top source/drain plug and the gate structure 110 at a top corner of the spacer 120.

The process of forming the gate plug generally includes the step of etching the top dielectric layer and the gate cap layer 115 to form a gate contact hole exposing the gate structure 110. By providing the etching barrier layer 160, in the process of forming the gate contact hole, the etching barrier layer 160 can define a lateral etching stop position, and the etching barrier layer 160 can protect the spacer 120, thereby helping reduce a probability that the spacer 120 is mistakenly etched by using the etching process of forming the gate contact hole, and further prevent a problem of bridging or breakdown between the gate plug and the bottom source/drain plug 150 at the top corner of the spacer 120.

Based on the foregoing, embodiments and implementations of the present disclosure help improve the performance and production manufacturing yield of the semiconductor structure.

The base 100 provides a process platform for processes. In some implementations, the base 100 is configured to form a FinFET, and the base 100 includes a substrate (not shown) and a fin (not shown) located protruding from the substrate.

In some implementations, the substrate is a silicon substrate. In some implementations, the fin has the same material as the substrate. When the device is in operation, the gate structure 110 is configured to control on or off of a conductive channel.

In some implementations, the gate structure 110 is located on the substrate, and spans the fin and covers a part of a top surface and a part of a side wall of the fin.

In some implementations, the gate structure 110 is a metal gate structure. The gate structure 110 includes a high-k gate dielectric layer (not shown) and a gate electrode layer (not shown) located on the high-k gate dielectric layer.

The spacer 120 is configured to define a forming area of the source/drain doped layer 130, and is further configured to protect the side wall of the gate structure 110. In some implementations, the spacer 120 is an ONO structure.

When the device is in operation, the source/drain doped layer 130 is configured to provide stress for the channel, to improve the carrier mobility. In some implementations, the source/drain doped layer 130 is located in the gate structure 110 and the fin on two sides of the spacer 120.

When an NMOS transistor is formed, the source/drain doped layer 130 includes Si or SiC doped with N-type ions, which is configured to provide a tensile stress effect for a channel area of the NMOS transistor. When a PMOS transistor is formed, the source/drain doped layer 130 includes Si or SiGe doped with P-type ions, which is configured to provide a compressive stress effect for a channel area of the PMOS transistor.

In some implementations, adjacent gate structures 110 share one source/drain doped layer 130.

The bottom dielectric layer 140 is configured to implement isolation between adjacent devices, and electrical isolation between bottom source/drain plugs 150. In some implementations, a material of the bottom dielectric layer 140 is silicon oxide.

The bottom source/drain plug 150 is configured to implement an electrical connection between the bottom source/drain plug 130 and an external circuit or other interconnection structures. In some implementations, a material of the bottom source/drain plug 150 is copper.

A gate plug that is in contact with the gate structure 110 is subsequently formed on the base 100 of an AA, and the source/drain cap layer 155 is located on the top surface of the bottom source/drain plug 150, and is configured to protect the bottom source/drain plug 150 in the process of forming the gate plug, thereby helping reduce a probability of damage to the bottom source/drain plug 150 and a short-circuit problem between the gate plug and the bottom source/drain plug 150.

The source/drain cap layer 155 selects a material having etching selectivity with the gate cap layer 115, the spacer 120, the bottom dielectric layer 140, and the subsequently formed top dielectric layer, thereby ensuring that the source/drain cap layer 155 can protect the bottom source/drain plug 150. In some implementations, a material of the source/drain cap layer 155 includes one or more of $SiO_2$, SiC, SiCO, $Si_3N_4$, and $SiC_xN_y$.

The subsequent steps further include: forming a top source/drain plug that is in contact with the bottom source/drain plug 150 on the bottom source/drain plug 150, where the gate cap layer 115 is located on the top surface of the gate structure 110, and is configured to protect the gate structure 110, thereby helping reduce a probability of damage to the gate structure 110 and a short-circuit problem between the top source/drain plug and the gate structure 110.

The gate cap layer 115 selects a material having etching selectivity with the source/drain cap layer 155, the spacer 120, the bottom dielectric layer 140, and the subsequently formed top dielectric layer, thereby helping ensure that the gate cap layer 115 can protect the gate structure 110. A material of the gate cap layer 115 includes one or more of SiC, SiCO, $Si_3N_4$, $SiC_xN_y$, SiCN—C+ and SiCN—N+.

The etching barrier layer 160 covers the top surface of the spacer 120, and is located between the gate cap layer 115 and the source/drain cap layer 155. In the subsequent step of forming the top source/drain contact hole, the etching barrier layer 160 can define the lateral etching stop position, and the etching barrier layer 160 can protect the spacer 120, thereby helping reduce a probability that the spacer 120 is mistakenly etched by using the etching process of forming the top source/drain contact hole. Moreover, the etching barrier layer 160 can further isolate the top source/drain plug from the gate structure 110. Both of the two aspects help prevent the problem of bridging or breakdown between the top source/drain plug and the gate structure 110 at the top corner of the spacer 120.

In the subsequent process of forming the gate contact hole, the etching barrier layer 160 can define a lateral etching stop position, and the etching barrier layer 160 can protect the spacer 120, thereby helping reduce the probability that the spacer 120 is mistakenly etched by the etching process of forming the gate contact hole, and further prevent the problem of bridging or breakdown between the gate plug and the bottom source/drain plug 150 at the top corner of the spacer 120.

Based on this, the etching barrier layer 160 selects a material having etching selectivity with the gate cap layer 115, the source/drain cap layer 155, the spacer 120, the bottom dielectric layer 140, and the subsequent top dielectric layer, and the etching process of subsequently forming the top source/drain contact hole or the gate contact hole has a low etching rate on the etching barrier layer 160. A material of the etching barrier layer 160 includes one or more of silicon oxycarbide, silicon oxynitride, and silicon nitride.

In an example, the etching barrier layer 160 is located on the side wall of the gate cap layer 115 and covers the top surface of the spacer 120; and the source/drain cap layer 155 covers the side wall of the etching barrier layer 160, because the etching barrier layer 160 is formed after the bottom source/drain plug 150 and the gate cap layer 115 are formed.

The semiconductor structure further includes: an adhesion layer 165, located between the etching barrier layer 160 and the spacer 120, and located between the etching barrier layer 160 and the gate cap layer 115. Correspondingly, the etching barrier layer 160 covers the adhesion layer 165 located on the top surface of the spacer 120 and the side wall of the gate cap layer 115.

The adhesion layer 165 has a stress buffering effect between the etching barrier layer 160 and the spacer 120, or between the gate cap layer 115 and the etching barrier layer 160, to improve adhesiveness between the etching barrier layer 160 and the spacer 120, and adhesiveness between the gate cap layer 115 and the etching barrier layer 160, thereby reducing the problems of defects such as a relatively large stress and dislocations because the etching barrier layer 160 is directly in contact with the side wall of the gate cap layer 115 and the top surface of the spacer 120. In some implementations, a material of the adhesion layer 165 includes one or more of silicon carbide, silicon oxide, titanium nitride, tantalum, and tantalum nitride.

The semiconductor structure may be formed using forms of the forming method described in the foregoing embodiments and implementations, or may be formed using other forming methods. For detailed descriptions of the semiconductor structure in the present embodiments and implementations, reference may be made to corresponding descriptions in the foregoing embodiment and implementations. Details are not described herein again in the present embodiment.

FIG. 26 is a schematic structural diagram of another embodiment of a semiconductor structure of the present disclosure. Similarities between the present embodiment and the foregoing embodiments are not described herein again, and differences are as follows:

The etching barrier layer 260 is located on the side wall of the source/drain cap layer 255 and covers the top surface of the spacer 220; and the gate cap layer 215 covers the side wall of the etching barrier layer 260.

The semiconductor structure further includes: an adhesion layer 265, located between the etching barrier layer 260 and the spacer 220, and located between the etching barrier layer 260 and the source/drain cap layer 255. In some implementations, the etching barrier layer 260 covers the adhesion layer 265 located on the top surface of the spacer 220 and the side wall of the source/drain cap layer 255.

The semiconductor structure may be formed by using forms of the forming method described in the foregoing embodiments and implementations, or may be formed by using other forming methods. For detailed descriptions of the semiconductor structure in the present embodiments and implementations, reference may be made to corresponding descriptions in the foregoing embodiment and implementations. Details are not described herein again in the present embodiment.

FIG. 36 is a schematic structural diagram of still another form of a semiconductor structure according to the present disclosure. Similarities between the present embodiment and implementations and the foregoing embodiments and implementations are not described herein again, and differences are as follows: the base 300 includes a first device unit area I and a second device unit area II; the gate cap layer 315 includes a first gate cap layer 315a located in the first device unit area I and a second gate cap layer 315b located in the second device unit area II; the etching barrier layer 360 includes a first etching barrier layer 360a located in the first device unit area I and a second etching barrier layer 360b located in the second device unit area II; the first etching barrier layer 360a is located on a side wall of the first gate cap layer 315a, and covers the top surface of the spacer 220; a source/drain cap layer 355 of the first device unit area I covers a side wall of the first etching barrier layer 360a; the second etching barrier layer 360b is located on a side wall of the source/drain cap layer 355 in the second device unit area II, and covers the top surface of the spacer 220; and the second gate cap layer 315b covers a side wall of the second etching barrier layer 360b.

In some implementations, the gate structure 310 is further located on the base 300 at a junction between the first device unit area I and the second device unit area II. The semiconductor structure further includes: an isolation cap layer 317, located on the top surface of the gate structure 310 at the junction of the first device unit area I and the second device unit area II.

Subsequently, the gate structure 310 and the isolation cap layer 317 at the junction of the first device unit area I and the second device unit area II may be further removed, to form an isolation structure on the base 300 at the junction of the first device unit area I and the second device unit area II, thereby isolating the first device unit area I from the second device unit area II.

In some implementations, the semiconductor structure further includes: a first adhesion layer 365a, located on the side wall of the first gate cap layer 315a and the top surface of the spacer 320 in the first device unit area I, where the first etching barrier layer 360a covers the first adhesion layer 365a located on the top surface of the spacer 320 and the side wall of the first gate cap layer 315a.

In some implementations, the semiconductor structure further includes: a second adhesion layer 365b, located on the side wall of the source/drain cap layer 355 and the top surface of the spacer 320, where the second etching barrier layer 360b covers the second adhesion layer 365b located on the top surface of the spacer 320 and the side wall of the source/drain cap layer 355.

The semiconductor structure may be formed by using forms of the forming method described in the foregoing embodiments and implementations, or may be formed by using other forming methods. For detailed descriptions of the semiconductor structure in the present embodiment and implementations, reference may be made to corresponding descriptions in the foregoing embodiments and implementations. Details are not described herein again in the present embodiment.

Although the present disclosure is disclosed above, the present disclosure is not limited thereto. Any person skilled in the art can make various changes and modifications without departing from the spirit and the scope of the present disclosure. Therefore the protection scope of the present disclosure should be subject to the scope defined by the claims.

What is claimed is:

1. A forming method of a semiconductor structure, comprising:
providing a base, wherein:
a discrete gate structure is formed on the base,
a spacer is formed on a side wall of the gate structure,
a source/drain doped layer is formed in the base near two sides of the gate structure, and
a bottom dielectric layer covering the source/drain doped layer is formed on the two sides of the gate structure;
forming:
a bottom source/drain plug located above and in contact with the source/drain doped layer,
a source/drain cap layer located on a top surface of the bottom source/drain plug,
a gate cap layer located on a top surface of the gate structure, and
an etching barrier layer located between the gate cap layer and the source/drain cap layer, on a side wall of the gate cap layer, and covering a top surface of the spacer after the bottom source/drain plug and the gate cap layer are formed, wherein the source/drain cap layer covers a side wall of the etching barrier layer on the top surface of the bottom source/drain plug;
forming a top dielectric layer covering the gate cap layer, the source/drain cap layer, and the etching barrier layer;
forming a top source/drain plug that extends through the source/drain cap layer and the top dielectric layer to be in contact with the bottom source/drain plug; and
forming a gate plug that extends through the gate cap layer and the top dielectric layer to be in contact with the gate structure;
forming an adhesion layer located on the side wall of the gate cap layer and the top surface of the spacer in the step of forming the etching barrier layer, wherein the etching barrier layer covers the adhesion layer located on the top surface of the spacer and the side wall of the gate cap layer.

2. The forming method of a semiconductor structure according to claim 1, wherein the step of forming the bottom source/drain plug, the source/drain cap layer, the gate cap layer, and the etching barrier layer comprises:
forming the etching barrier layer on a side wall of the source/drain cap layer after the bottom source/drain plug and the source/drain cap layer are formed; and
forming the gate cap layer covering a side wall of the etching barrier layer on the top surface of the gate structure.

3. The forming method of a semiconductor structure according to claim 1, wherein:

the base comprises a first device unit area and a second device unit area;
the gate cap layer comprises a first gate cap layer located in the first device unit area and a second gate cap layer located in the second device unit area; and
the etching barrier layer comprises a first etching barrier layer located in the first device unit area and a second etching barrier layer located in the second device unit area;
the first etching barrier layer is formed on a side wall of the first gate cap layer and covers the top surface of the spacer;
a source/drain cap layer of the first device unit area covers a side wall of the first etching barrier layer;
the second etching barrier layer is formed on a side wall of the source/drain cap layer in the second device unit area and covers the top surface of the spacer; and
the second gate cap layer covers a side wall of the second etching barrier layer.

4. The forming method of a semiconductor structure according to claim 1, wherein the step of forming the bottom source/drain plug, the source/drain cap layer, the gate cap layer, and the etching barrier layer comprises:
etching back a part of a thickness of the gate structure to form the gate cap layer on the top surface of the gate structure, wherein the spacer covers the side walls of the gate structure and the gate cap layer;
etching back a part of a thickness of the spacer, to expose a part of a side wall of the gate cap layer;
forming the bottom source/drain plug above the source/drain doped layer, wherein the top surface of the bottom source/drain plug is lower than a top surface of the gate cap layer;
forming the etching barrier layer on the side wall of the gate cap layer exposed by the bottom source/drain plug; and
forming the source/drain cap layer covering the side wall of the etching barrier layer on the top surface of the bottom source/drain plug.

5. The forming method of a semiconductor structure according to claim 2, wherein the step of forming the bottom source/drain plug, the source/drain cap layer, the gate cap layer, and the etching barrier layer comprises:
etching back a part of a thickness of the gate structure to form a sacrificial cap layer on the top surface of the gate structure, wherein the spacer covers the side walls of the gate structure and the sacrificial cap layer;
forming the bottom source/drain plug above the source/drain doped layer and the source/drain cap layer located on the bottom source/drain plug, wherein the side walls of the bottom source/drain plug and the source/drain cap layer are in contact with a side wall of the spacer;
removing the sacrificial cap layer and the spacer on the side wall of the sacrificial cap layer to expose the top surface of the gate structure and the side wall of the source/drain cap layer;
forming the etching barrier layer covering the top surface of the spacer on the side wall of the source/drain cap layer; and
forming the gate cap layer covering the side wall of the etching barrier layer on the top surface of the gate structure.

6. The forming method of a semiconductor structure according to claim 3, wherein the step of forming the bottom source/drain plug, the source/drain cap layer, the gate cap layer, and the etching barrier layer comprises:

removing a part of a thickness of the gate structure to form an initial cap layer on the top surface of the gate structure, wherein the initial cap layer comprises a first gate cap layer located in the first device unit area and a sacrificial cap layer located in the second device unit area;

etching back a part of a height of the spacer in the first device unit area to expose the side wall of the first gate cap layer;

forming the bottom source/drain plug above the source/drain doped layer and the first etching barrier layer on the side wall of the first gate cap layer exposed by the bottom source/drain plug, wherein the top surface of the bottom source/drain plug is lower than top surfaces of the first gate cap layer and the sacrificial cap layer;

forming the source/drain cap layer on the top surface of the bottom source/drain plug, wherein the source/drain cap layer of the first device unit area covers the side wall of the first etching barrier layer, and the source/drain cap layer of the second device unit area covers the side wall of the spacer;

removing the sacrificial cap layer and the spacer on the side wall of the sacrificial cap layer to expose the top surface of the gate structure and the side wall of the source/drain cap layer in the second device unit area;

forming the second etching barrier layer on the side wall of the source/drain cap layer in the second device unit area; and forming the second gate cap layer on the top surface of the gate structure in the second device unit area to cover the side wall of the second etching barrier layer.

7. The forming method of a semiconductor structure according to claim 2, further comprising:

further forming an adhesion layer located on the side wall of the source/drain cap layer and the top surface of the spacer in the step of forming the etching barrier layer, wherein the etching barrier layer covers the adhesion layer located on the top surface of the spacer and the side wall of the source/drain cap layer.

8. The forming method of a semiconductor structure according to claim 4, wherein the step of forming the bottom source/drain plug comprises:

etching the bottom dielectric layer above the source/drain doped layer to form a bottom source/drain contact hole exposing the source/drain doped layer;

forming an initial plug in the bottom source/drain contact hole, wherein a top surface of the initial plug is flush with the top surface of the gate cap layer;

etching back a part of a thickness of the initial plug to form the bottom source/drain plug; and etching back the part of the thickness of the spacer in the process of forming the bottom source/drain contact hole, or etching back the part of the thickness of the spacer in the process of etching back the part of the thickness of the initial plug.

9. The forming method of a semiconductor structure according to claim 1, wherein:

a direction parallel to the base and perpendicular to an extension direction of the gate structure is a lateral direction, and the step of forming the top source/drain plug comprises:

etching the top dielectric layer and the source/drain cap layer above the bottom source/drain plug using the etching barrier layer as a lateral etching stop position to form a top source/drain contact hole exposing the bottom source/drain plug; and forming the top source/drain plug filled in the top source/drain contact hole.

10. The forming method of a semiconductor structure according to claim 1, wherein:

a direction parallel to the base and perpendicular to an extension direction of the gate structure is a lateral direction, and the step of forming the gate plug comprises:

etching the top dielectric layer and the gate cap layer above the gate structure using the etching barrier layer as a lateral etching stop position to form a gate contact hole exposing the gate structure; and forming the gate plug filled in the gate contact hole.

11. A semiconductor structure, comprising:

a base;

a gate structure, discretely disposed on the base;

a spacer, located on a side wall of the gate structure;

a source/drain doped layer, located in the base near two sides of the gate structure;

a bottom source/drain plug, located above the source/drain doped layer, wherein a bottom of the bottom source/drain plug is in contact with the source/drain doped layer;

a gate cap layer, located on a top surface of the gate structure;

a source/drain cap layer, located on a top surface of the bottom source/drain plug;

an etching barrier layer, located between the gate cap layer and the source/drain cap layer and covering a top surface of the spacer, located on a side wall of the gate cap layer, and covering the top surface of the spacer, where the source/drain cap layer covers a side wall of the etching barrier layer; and an adhesion layer, located between the etching barrier layer and the spacer, and located between the etching barrier layer and the gate cap layer.

12. The semiconductor structure according to claim 11, wherein the etching barrier layer is located on a side wall of the source/drain cap layer and covers the top surface of the spacer, and the gate cap layer covers a side wall of the etching barrier layer.

13. The semiconductor structure according to claim 11, wherein:

the base comprises a first device unit area and a second device unit area;

the gate cap layer comprises a first gate cap layer located in the first device unit area and a second gate cap layer located in the second device unit area;

the etching barrier layer comprises a first etching barrier layer located in the first device unit area and a second etching barrier layer located in the second device unit area;

the first etching barrier layer is located on a side wall of the first gate cap layer and covers the top surface of the spacer;

a source/drain cap layer of the first device unit area covers a side wall of the first etching barrier layer;

the second etching barrier layer is located on a side wall of the source/drain cap layer in the second device unit area and covers the top surface of the spacer; and the second gate cap layer covers a side wall of the second etching barrier layer.

14. The semiconductor structure according to claim 12, further comprising:

an adhesion layer, located between the etching barrier layer and the spacer, and located between the etching barrier layer and the source/drain cap layer.

15. The semiconductor structure according to claim 11, wherein a material of the adhesion layer comprises at least one of silicon carbide, silicon oxide, titanium nitride, tantalum, or tantalum nitride.

16. The semiconductor structure according to claim 11, wherein a material of the etching barrier layer comprises at least one of silicon oxycarbide, silicon oxynitride, or silicon nitride.

* * * * *